United States Patent
Seo et al.

(10) Patent No.: US 9,130,182 B2
(45) Date of Patent: Sep. 8, 2015

(54) LIGHT-EMITTING ELEMENT, LIGHTING DEVICE, LIGHT-EMITTING DEVICE, AND ELECTRONIC DEVICE

(71) Applicant: Semiconductor Energy Laboratory Co., Ltd., Kanagawa-ken (JP)

(72) Inventors: Hiromi Seo, Kanagawa (JP); Tatsuyoshi Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/313,356

(22) Filed: Jun. 24, 2014

(65) Prior Publication Data
US 2015/0001502 A1    Jan. 1, 2015

(30) Foreign Application Priority Data
Jun. 28, 2013   (JP) .................................. 2013-135716

(51) Int. Cl.
*H01L 29/72* (2006.01)
*H01L 51/50* (2006.01)
*H01L 51/52* (2006.01)

(52) U.S. Cl.
CPC ........ *H01L 51/5012* (2013.01); *H01L 51/5056* (2013.01); *H01L 51/5072* (2013.01); *H01L 51/5206* (2013.01); *H01L 51/5221* (2013.01)

(58) Field of Classification Search
CPC .................................................... H01L 1/0545
USPC ......................................................... 257/40
See application file for complete search history.

(56) References Cited

U.S. PATENT DOCUMENTS

| | | |
|---|---|---|
| 2003/0068528 A1 | 4/2003 | Thompson et al. |
| 2006/0134464 A1 | 6/2006 | Nariyuki |
| 2010/0221547 A1* | 9/2010 | Nakayama et al. ........ 428/411.1 |
| 2011/0284799 A1* | 11/2011 | Stoessel et al. .......... 252/301.16 |
| 2012/0205632 A1 | 8/2012 | Shitagaki et al. |
| 2012/0206035 A1 | 8/2012 | Shitagaki et al. |
| 2012/0248968 A1* | 10/2012 | Ogiwara et al. .............. 313/504 |
| 2013/0207088 A1 | 8/2013 | Seo |
| 2013/0306945 A1 | 11/2013 | Seo |

(Continued)

FOREIGN PATENT DOCUMENTS

| | | |
|---|---|---|
| JP | 2006-60198 | 3/2006 |
| WO | WO 00/70655 A2 | 11/2000 |

OTHER PUBLICATIONS

Adamovich, V. et al, "High Efficiency Single Dopant White Electrophosphorescent Light Emitting Diodes," New J. Chem., 2002, vol. 26, pp. 1171-1178.

*Primary Examiner* — Edward Wojciechowicz
(74) *Attorney, Agent, or Firm* — Husch Blackwell LLP

(57) ABSTRACT

A light-emitting element with high emission efficiency is provided. A light-emitting element with a long lifetime is provided. The light-emitting element includes an anode; a hole-transport layer over the anode, containing a hole-transport compound and a compound; a light-emitting layer over the hole-transport layer, containing a host material and a guest material; and a cathode over the light-emitting layer. The host material is an electron-transport compound. The guest material and the compound are each independently a phosphorescent compound or a thermally activated delayed fluorescence material. A peak of an emission spectrum of the compound is on a shorter wavelength side than a peak of an emission spectrum of the guest material. Only the guest material emits light.

14 Claims, 15 Drawing Sheets

(56) References Cited

U.S. PATENT DOCUMENTS

| | | |
|---|---|---|
| 2014/0034926 A1 | 2/2014 | Matsubara et al. |
| 2014/0034927 A1 | 2/2014 | Seo et al. |
| 2014/0034930 A1 | 2/2014 | Seo et al. |
| 2014/0034931 A1 | 2/2014 | Inoue et al. |
| 2014/0034932 A1 | 2/2014 | Seo et al. |

* cited by examiner

LIGHT-EMITTING ELEMENT, LIGHTING DEVICE, LIGHT-EMITTING DEVICE, AND ELECTRONIC DEVICE

BACKGROUND OF THE INVENTION

1. Field of the Invention

The present invention relates to a light-emitting element, a lighting device, a light-emitting device, and an electronic device. In particular, the present invention relates to a light-emitting element, a lighting device, a light-emitting device, and an electronic device utilizing electroluminescence (EL).

2. Description of the Related Art

Research and development have been extensively conducted on light-emitting elements utilizing EL. In a basic structure of the light-emitting element, a layer containing a light-emitting organic compound (hereinafter also referred to as an EL layer) is sandwiched between a pair of electrodes. The light-emitting element utilizing EL has attracted attention as a next-generation flat panel display element owing to characteristics such as feasibility of being thinner and lighter, high-speed response to input signals, and capability of direct current low voltage driving. In addition, a display using the light-emitting element has a feature that it is excellent in contrast and image quality, and has a wide viewing angle. Further, since the light-emitting element is a plane light source, application of the light-emitting element as a light source such as a backlight of a liquid crystal display and an illumination device is proposed.

In the case of a light-emitting element in which a layer containing an organic compound used as a light-emitting substance is provided between a pair of electrodes, by applying a voltage to the element, electrons from a cathode and holes from an anode are injected into the layer containing the organic compound and thus a current flows. The injected electrons and holes then lead the organic compound to its excited state, so that light emission is obtained from the excited organic compound.

As the excited state caused by an organic compound, there are a singlet excited state (S*) and a triplet excited state (T*). Light emission from a singlet excited state is referred to as fluorescence and light emission from a triplet excited state is referred to as phosphorescence. Here, in a compound that emits fluorescence (hereinafter also referred to as a fluorescent compound), in general, phosphorescence is not observed at room temperature, and only fluorescence is observed. Accordingly, the internal quantum efficiency (the ratio of generated photons to injected carriers) of a light-emitting element including the fluorescent compound is assumed to have a theoretical limit of 25% based on the ratio of the singlet excited state to the triplet excited state.

Meanwhile, when a compound that emits phosphorescence (hereinafter also referred to as a phosphorescent compound) is used, the internal quantum efficiency can be theoretically increased to 100%. That is, higher emission efficiency can be obtained than using a fluorescent compound. For these reasons, a light-emitting element including a phosphorescent compound has been actively developed in recent years in order to obtain a light-emitting element with high emission efficiency.

As the phosphorescent compound, an organometallic complex that has iridium or the like as a central metal has particularly attracted attention because of its high phosphorescence quantum yield; for example, an organometallic complex that has iridium as a central metal is disclosed as a phosphorescent material in Patent Document 1.

REFERENCE

Patent Document

[Patent Document 1] International Publication WO 00/70655 pamphlet

SUMMARY OF THE INVENTION

Development of a light-emitting element using a phosphorescent compound still leaves room for improvement in terms of emission efficiency, reliability, cost, and the like. Thus, improvement of an element structure, development of a substance, and the like are being carried out.

In view of the above, an object of one embodiment of the present invention is to provide a light-emitting element with high emission efficiency. An object of one embodiment of the present invention is to provide a light-emitting element with a long lifetime.

An object of one embodiment of the present invention is to provide a light-emitting device, an electronic device, or a lighting device with low power consumption by using the above light-emitting element. An object of one embodiment of the present invention is to provide a light-emitting device, an electronic device, or a lighting device with high reliability by using the above light-emitting element.

In one embodiment of the present invention, there is no need to achieve all the above objects.

One embodiment of the present invention is a light-emitting element that includes an anode; a hole-transport layer over the anode, containing a hole-transport compound and a compound; a light-emitting layer over the hole-transport layer, containing a host material and a guest material; and a cathode over the light-emitting layer. The compound is a phosphorescent compound or a thermally activated delayed fluorescence material. The host material is an electron-transport compound. The guest material is a phosphorescent compound or a thermally activated delayed fluorescence material. A peak of an emission spectrum of the compound is on a shorter wavelength side than a peak of an emission spectrum of the guest material. Only the guest material emits light.

One embodiment of the present invention is a light-emitting element that includes an anode; a hole-transport layer over the anode, containing a hole-transport compound and a compound; a light-emitting layer over and in contact with the hole-transport layer, containing a host material and a guest material; and a cathode over the light-emitting layer. The compound is a phosphorescent compound or a thermally activated delayed fluorescence material. The host material is an electron-transport compound. The guest material is a phosphorescent compound or a thermally activated delayed fluorescence material. A peak of an emission spectrum of the compound is on a shorter wavelength side than a peak of an emission spectrum of the guest material. Only the guest material emits light.

In a light-emitting element having any one of the above structures, the hole-transport compound preferably has an electron-blocking property.

In a light-emitting element having any one of the above structures, the electron-transport compound preferably has a hole-blocking property.

In a light-emitting element having any one of the above structures, the electron-transport compound preferably forms an exciplex in combination with the compound.

In a light-emitting element having any one of the above structures, it is preferable that the compound and the guest material be each an organometallic complex containing iridium.

A lighting device that includes a light-emitting element having any one of the above structures, and a light-emitting device that includes a light-emitting element having any one of the above structures and a unit for controlling the light-emitting element are also embodiments of the present invention. An electronic device that includes the light-emitting device in a display portion is also one embodiment of the present invention.

Note that the light-emitting device in this specification includes, in its category, a display device using a light-emitting element. Further, the category of the light-emitting device in this specification includes a module in which a light-emitting device is provided with a connector such as an anisotropic conductive film or a tape carrier package (TCP); a module having a TCP at the tip of which a printed wiring board is provided; and a module in which an integrated circuit (IC) is directly mounted on a light-emitting device by a chip on glass (COG) method. Furthermore, the category includes a light-emitting device which is used in lighting equipment or the like.

In one embodiment of the present invention, a light-emitting element with high emission efficiency can be provided. In one embodiment of the present invention, a light-emitting element with a long lifetime can be provided.

In one embodiment of the present invention, a light-emitting device, an electronic device, or a lighting device with low power consumption can be provided by using the above light-emitting element. In one embodiment of the present invention, a light-emitting device, an electronic device, or a lighting device with high reliability can be provided by using the above light-emitting element.

DETAILED DESCRIPTION OF THE INVENTION

Figure 1A:
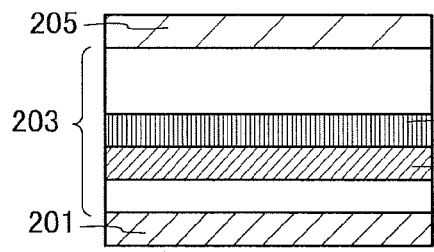
FIGS. 1A to 1D each illustrate an example of a light-emitting element of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

In this embodiment, light-emitting elements of embodiments of the present invention will be described with reference to FIGS. 1A to 1D.

A light-emitting element of one embodiment of the present invention includes an anode; a hole-transport layer over the anode, containing a hole-transport compound and a compound; a light-emitting layer over the hole-transport layer, containing a host material (an electron-transport compound) and a guest material; and a cathode over the light-emitting layer. The compound is a phosphorescent compound or a thermally activated delayed fluorescence material whose emission spectrum has a peak on a shorter wavelength side than a peak of an emission spectrum of the guest material. Only light emission from the guest material is extracted from the light-emitting element. A light-emitting element having the above structure in which the hole-transport layer and the light-emitting layer are in contact with each other is also one embodiment of the present invention.

Note that in the present specification, a substance exhibiting thermally activated delayed fluorescence (TADF) is referred to as a thermally activated delayed fluorescence material. Here, the term "delayed fluorescence" refers to light emission having the same spectrum as normal fluorescence and an extremely long lifetime. The lifetime is $10^{-6}$ seconds or longer, preferably $10^{-3}$ seconds or longer.

In a light-emitting element in which an electron-transport compound is used as a host material of a light-emitting layer and a hole-transport layer consists only of a hole-transport compound, recombination of carriers (electrons and holes) easily occurs in the vicinity of the interface between the hole-transport layer and the light-emitting layer, in which case not only a guest material of the light-emitting layer but also the hole-transport compound might be excited. This phenomenon is more likely to be produced when the hole-transport compound and the electron-transport compound have a higher electron-blocking property and a higher hole-blocking property, respectively. In this light-emitting element, when the hole-transport compound is a fluorescent compound, it is difficult for both the energy of excitons in a singlet excited state of the hole-transport compound and the energy of excitons in a triplet excited state of the hole-transport compound to be transferred to an excited state of the guest material of the light-emitting layer. Accordingly, the light-emitting element can utilize only part of the energy of generated excitons to make the guest material of the light-emitting layer emit light, so that light emission by the guest material of the light light-emitting layer is inhibited and the emission efficiency of the light-emitting element is low.

On the contrary, in the light-emitting element of one embodiment of the present invention, the hole-transport layer contains not only the hole-transport compound but also the phosphorescent compound or the thermally activated delayed fluorescence material. As the phosphorescent compound or the thermally activated delayed fluorescence material, the compound whose emission spectrum has a peak on a shorter wavelength side than a peak of an emission spectrum of the guest material of the light-emitting layer is used.

To compare the peak of the emission spectrum of the compound and the peak of the emission spectrum of the guest material, for example, emission spectra that are obtained by measuring photoluminescence of the compound and the guest material dissolved in the same solvent can be used. Specifically, it is possible to compare a peak of an emission spectrum of the compound in a toluene solvent and a peak of an emission spectrum of the guest material in a toluene solvent.

Alternatively, it is possible to use an emission spectrum of a light-emitting element whose light-emitting layer contains the compound and a host material, and an emission spectrum of a light-emitting element whose light-emitting layer contains the guest material and the host material. In that case, the two light-emitting elements are preferably different only in the structure of the light-emitting layer. Further alternatively, it is possible to use an emission spectrum of a light-emitting element whose light-emitting layer contains the hole-transport compound and the compound used in the light-emitting element of one embodiment of the present invention, and an emission spectrum of a light-emitting element whose light-emitting layer contains the host material and the guest material used in the light-emitting element of one embodiment of the present invention. In that case, the two light-emitting elements are preferably different only in the structure of their light-emitting layer.

First, the case where the hole-transport layer contains a hole-transport compound and a phosphorescent compound is described. Carrier recombination occurs in the vicinity of the interface between the hole-transport layer and the light-emitting layer or in the hole-transport layer to excite the phosphorescent compound in the hole-transport layer. A singlet excited state of the phosphorescent compound is converted into a triplet excited state by intersystem crossing. That is, excitons in the hole-transport layer are basically brought into a triplet excited state. The energy of the excitons in the triplet excited state can be transferred to an excited state of the guest material of the light-emitting layer by energy transfer utilizing dipole-dipole interaction (Förster mechanism). This results from the fact that the phosphorescent compound has a light-emitting property (the phosphorescence quantum yield of the phosphorescent compound is preferably as high as possible) and that direct absorption, which corresponds to electron transition from a singlet ground state to a singlet excited state or a triplet excited state, occurs in the guest material (an absorption spectrum of a singlet excited state or a triplet excited state exists). When these conditions are fulfilled, triplet-singlet energy transfer or triplet-triplet energy transfer from the phosphorescent compound to the guest material by the Förster mechanism is possible. In other words, with the use of the phosphorescent compound, both the energy of excitons in a singlet excited state and the energy of excitons in a triplet excited state can be transferred to an excited state of the guest material of the light-emitting layer. Thus, the energy of excitons generated in the vicinity of the interface between the hole-transport layer and the light-emitting layer or in the hole-transport layer can be utilized to make the guest material emit light.

Next, the case where the hole-transport layer contains a hole-transport compound and a thermally activated delayed fluorescence material is described. Carrier recombination occurs in the vicinity of the interface between the hole-transport layer and the light-emitting layer or in the hole-transport layer to excite the thermally activated delayed fluorescence material in the hole-transport layer. A triplet excited state of the thermally activated delayed fluorescence material is converted into a singlet excited state by reverse intersystem crossing. That is, excitons in the hole-transport layer are basically brought into a singlet excited state. The energy of the excitons in the singlet excited state can be transferred to an excited state of the guest material of the light-emitting layer by energy transfer utilizing the Förster mechanism. This results from the fact that the thermally activated delayed fluorescence material has a light-emitting property (the fluorescence quantum yield of the thermally activated delayed fluorescence material is preferably as high as possible) and that direct absorption, which corresponds to electron transition from a singlet ground state to a singlet excited state or a triplet excited state, occurs in the guest material (an absorption spectrum of a singlet excited state or a triplet excited state exists). When these conditions are fulfilled, singlet-singlet energy transfer or singlet-triplet energy transfer from the thermally activated delayed fluorescence material to the guest material by the Förster mechanism is possible. In other words, with the use of the thermally activated delayed fluorescence material, both the energy of excitons in a singlet excited state and the energy of excitons in a triplet excited state can be transferred to an excited state of the guest material of the light-emitting layer. Thus, the energy of excitons generated in the vicinity of the interface between the hole-transport layer and the light-emitting layer or in the hole-transport layer can be utilized to make the guest material emit light.

In the above manner, in the light-emitting element of one embodiment of the present invention, not only the energy of excitons generated in the light-emitting layer, but also the energy of excitons generated in the vicinity of the interface between the hole-transport layer and the light-emitting layer or in the hole-transport layer can be utilized to make the guest material emit light. In other words, even when carrier recombination in the hole-transport layer causes excitation of the phosphorescent compound or the thermally activated delayed fluorescence material of the hole-transport layer, the phosphorescent compound or the thermally activated delayed fluorescence material hardly emits light, whereby only light emission from the guest material is extracted from the light-emitting element. Therefore, application of one embodiment of the present invention can provide a light-emitting element having high emission efficiency.

It is particularly preferable that the hole-transport compound have an electron-blocking property, in which case entry of electrons from the light-emitting layer into the hole-transport layer (specifically, an area of the hole-transport layer which is close to the anode) can be inhibited to increase the probability of carrier recombination in the vicinity of the interface between the hole-transport layer and the light-emitting layer. In the present specification and the like, the hole-transport compound with an electron-blocking property has a shallower (higher) LUMO level than a compound contained in a layer with which the hole-transport layer is in contact on the cathode side and therefore, the hole-transport compound has an extremely low electron-injection property and an extremely low electron-transport property.

It is particularly preferable that the electron-transport compound have a hole-blocking property, in which case entry of holes from the hole-transport layer into the light-emitting layer (specifically, an area of the light-emitting layer which is close to the cathode) can be inhibited to increase the probability of carrier recombination in the vicinity of the interface between the hole-transport layer and the light-emitting layer. In the present specification and the like, the electron-transport compound with a hole-blocking property has a deeper (lower) HOMO level than a compound contained in a layer with which the light-emitting layer is in contact on the anode side and therefore, the electron-transport compound has an extremely low hole-injection property and an extremely low hole-transport property.

The electron-transport compound may form an exciplex in combination with the phosphorescent compound or thermally activated delayed fluorescence material of the hole-transport layer. In the light-emitting element of one embodiment of the present invention, even when carrier recombination in the vicinity of the interface between the hole-transport layer and the light-emitting layer causes the electron-transport compound to form an exciplex in combination with the phosphorescent compound or thermally activated delayed fluorescence material of the hole-transport layer, the excitation energy of the exciplex can be transferred to an excited state of the guest material.

That is, even when the electron-transport compound forms an exciplex in combination with the phosphorescent compound or thermally activated delayed fluorescence material of the hole-transport layer, the exciplex hardly emits light, so that only light emission from the guest material is extracted from the light-emitting element. Therefore, high emission efficiency can be achieved in the light-emitting element of one embodiment of the present invention.

Further, in the light-emitting element of one embodiment of the present invention, the threshold value of the voltage with which an exciplex is formed depends on the energy of a peak of the emission spectrum of the exciplex. When the emission spectrum of the exciplex peaks at 620 nm (2.0 eV), for example, the threshold value of the voltage that is needed when the exciplex is formed with electric energy is also approximately 2.0 V.

Here, when the energy of the peak of the emission spectrum of the exciplex is too high (i.e., when the wavelength is too short), the threshold value of the voltage with which an exciplex is formed also increases. That case is not preferred because a higher voltage is needed to make the guest material emit light by energy transfer from the exciplex to the guest material, and thus extra energy is consumed.

In view of this, it is preferable that the energy of the peak of the emission spectrum of the exciplex be lower (the wavelength be longer), in which case the threshold value of the voltage is smaller.

One embodiment of the present invention includes a light-emitting element in which the peak wavelength of the emission spectrum of the exciplex is longer than or equal to the peak wavelength of the absorption band located on the longest wavelength side of the absorption spectrum of the guest material (i.e., the energy of the emission peak of the exciplex is lower than or equal to the energy of the absorption peak of the guest material). In this light-emitting element, the value of the voltage with which an exciplex is formed through carrier recombination is smaller than the value of the voltage with which the guest material starts to emit light by carrier recombination.

In other words, even when the voltage that has a value smaller than that of the voltage with which the guest material starts to emit light is applied to the light-emitting element, recombination current starts to flow in the light-emitting element by exciplex formation through carrier recombination. Therefore, a light-emitting element with a low emission start voltage or a light-emitting element with a lower drive voltage (with more favorable voltage-current characteristics) can be provided.

Accordingly, at the time when the voltage reaches a value with which the guest material starts to emit light, a sufficient number of carriers exist in the light-emitting layer and carrier recombination which can contribute to light emission of the guest material smoothly occurs many times. Therefore, luminance becomes remarkably high at a voltage close to the threshold voltage (emission start voltage) of the guest material. In other words, a curve representing the voltage-luminance characteristics can be steep in a rising portion near the emission start voltage; thus, the drive voltage needed to obtain desired luminance can be low. Further, to achieve practical luminance, driving is performed with a voltage higher than or equal to the threshold voltage (emission start voltage) of the guest material, in which case emitted light originates mostly from the guest material and the light-emitting element is thus allowed to have high current efficiency.

As the guest material, any of a fluorescent compound, a phosphorescent compound, and a thermally activated delayed fluorescence material may be used.

The phosphorescent compound of the hole-transport layer and the phosphorescent compound that is used as the guest material are preferably organometallic complexes containing iridium. An organometallic complex containing iridium has advantages of having a high quantum yield and a high molar absorption coefficient. Energy transfer by the Förster mechanism is more likely to occur when the phosphorescent compound of the hole-transport layer has a higher phosphorescent quantum yield, which is preferably 0.1 or more, particularly preferably 0.5 or more, for example. Energy transfer by the Förster mechanism is more likely to occur when the guest material has a higher molar absorption coefficient; for example, the molar absorption coefficient of the absorption band on the longest wavelength side of the guest material is preferably 2000 $M^{-1}\cdot cm^{-1}$ or more, particularly preferably 5000 $M^{-1}\cdot cm^{-1}$ or more. Examples of a compound with such a high molar absorption coefficient include bis(3,5-dimethyl-2-phenylpyrazinato)(dipivaloylmethanato)iridium(III) (abbreviation: [Ir(mppr-Me)$_2$(dpm)]), (acetylacetonato)bis(4,6-diphenylpyrimidinato)iridium(III) (abbreviation: [Ir(dppm)$_2$ (acac)]), (acetylacetonato)bis(6-tert-butyl-4-phenylpyrimidinato)iridium(III) (abbreviation: [Ir(tBuppm)$_2$(acac)]), tris(4-t-butyl-6-phenylpyrimidinato)iridium(III) (abbreviation: [Ir(tBuppm)$_3$]), and tris[2-methyl-3-(6-tert-butyl-4-pyrimidinyl-κN3)pyridyl-κC4]iridium(III) (abbreviation: [Ir(tBumpypm)$_3$]).

<<Structural Example of Light-Emitting Element>>

A light-emitting element illustrated in FIG. 1A includes an EL layer 203 between a first electrode 201 and a second electrode 205. In this embodiment, the first electrode 201 serves as an anode, and the second electrode 205 serves as a cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes recombine in the EL layer 203 and a light-emitting substance contained in the EL layer 203 emits light.

The EL layer 203 includes at least a light-emitting layer 303 containing a light-emitting substance and a hole-transport layer 302 between the light-emitting layer 303 and the anode.

Further, when a plurality of light-emitting layers are provided in the EL layer and emission colors of the light-emitting layers are made different, light emission of a desired color can be provided from the light-emitting element as a whole. For example, in a light-emitting element having two light-emitting layers, the emission colors of first and second light-emitting layers are complementary, so that the light-emitting element can emit white light as a whole. Note that the word "complementary" means color relationship in which an achromatic color is obtained when colors are mixed. In other words, when light components obtained from substances which emit light of complementary colors are mixed, white emission can be obtained. Further, the same applies to a light-emitting element having three or more light-emitting layers.

In addition to the light-emitting layer and the hole-transport layer, the EL layer 203 may include a layer containing a substance with a high hole-injection property, a substance with a high electron-transport property, a substance with a high electron-injection property, a substance with a bipolar property (a substance with a high electron-transport property and a high hole-transport property), or the like. For the EL layer 203, either a low molecular compound or a high molecular compound can be used, and an inorganic compound may also be used.

Figure 1B:
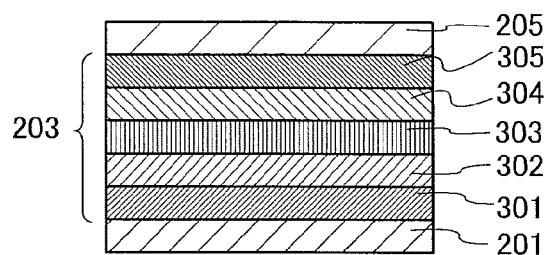

A light-emitting element illustrated in FIG. 1B includes the EL layer 203 between the first electrode 201 and the second electrode 205, and in the EL layer 203, a hole-injection layer 301, the hole-transport layer 302, the light-emitting layer 303, an electron-transport layer 304, and an electron-injection layer 305 are stacked in that order from the first electrode 201 side.

Figure 1C:
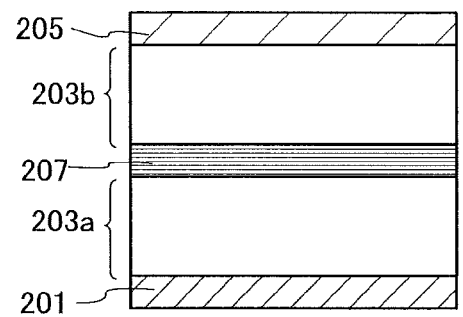
Figure 1D:
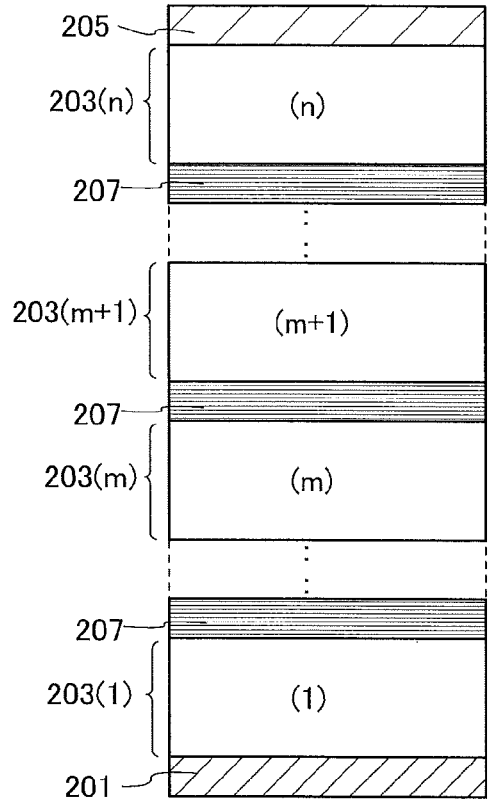

As in light-emitting elements illustrated in FIGS. 1C and 1D, a plurality of EL layers may be stacked between the first electrode 201 and the second electrode 205. In this case, an intermediate layer 207 is preferably provided between the stacked EL layers. The intermediate layer 207 includes at least a charge-generation region.

For example, the light-emitting element illustrated in FIG. 1C includes the intermediate layer 207 between a first EL layer 203a and a second EL layer 203b. The light-emitting element illustrated in FIG. 1D includes n EL layers (n is a natural number of 2 or more), and the intermediate layers 207 between the EL layers.

The following shows behaviors of electrons and holes in the intermediate layer 207 between the EL layer 203(m) and the EL layer 203(m+1). When a voltage higher than the threshold voltage of the light-emitting element is applied between the first electrode 201 and the second electrode 205, holes and electrons are generated in the intermediate layer 207, and the holes move into the EL layer 203(m+1) provided on the second electrode 205 side and the electrons move into the EL layer 203(m) provided on the first electrode 201 side. The holes injected into the EL layer 203(m+1) recombine with the electrons injected from the second electrode 205 side, so that a light-emitting substance contained in the EL layer 203(m+1) emits light. Further, the electrons injected into the EL layer 203(m) recombine with the holes injected from the first electrode 201 side, so that a light-emitting substance contained in the EL layer 203(m) emits light. Thus, the holes and electrons generated in the intermediate layer 207 cause light emission in the respective EL layers.

Note that the EL layers can be provided in contact with each other with no intermediate layer provided therebetween when these EL layers allow the same structure as the intermediate layer to be formed therebetween. For example, when the charge-generation region is formed over one surface of an EL layer, another EL layer can be provided in contact with the surface.

Further, by forming EL layers to emit light of different colors from each other, a light-emitting element as a whole can provide light emission of a desired color. For example, in a light-emitting element having two EL layers, the emission colors of first and second EL layers are complementary, so that the light-emitting element can emit white light as a whole. The same applies to a light-emitting element having three or more EL layers.

<<Materials of Light-Emitting Element>>

Examples of materials that can be used for each layer will be described below. Note that each layer may have a single-layer structure or a stacked-layer structure including two or more layers.

<Anode>

The electrode serving as the anode can be formed using one or more kinds of conductive metals and alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, titanium, and a nitride of a metal material (e.g., titanium nitride). Alternatively, the electrode may be formed as follows: silver, copper, aluminum, titanium, or the like is formed to have a nanowire shape (or a stripe shape or a thin-stripe shape), and then a conductive substance (a conductive organic material, graphene, or the like) is formed thereover by a coating method, a printing method, or the like.

When the anode is in contact with the charge-generation region, any of a variety of conductive materials can be used regardless of their work functions; for example, aluminum, silver, an alloy containing aluminum, or the like can be used.

<Cathode>

The electrode serving as the cathode can be formed using one or more kinds of conductive metals and alloys, conductive compounds, and the like. In particular, it is preferable to use a material with a low work function (3.8 eV or less).

Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that in the case where the cathode is in contact with the charge-generation region, a variety of conductive materials can be used regardless of its work function. For example, ITO or indium tin oxide containing silicon or silicon oxide can be used.

The electrodes each can be formed by a vacuum evaporation method or a sputtering method. Alternatively, when a silver paste or the like is used, a coating method or an inkjet method can be used.

Emitted light is extracted out through one or both of the first electrode 201 and the second electrode 205. Therefore, one or both of the first electrode 201 and the second electrode 205 are light-transmitting electrodes. In the case where only the first electrode 201 is a light-transmitting electrode, light is extracted through the first electrode 201. In the case where only the second electrode 205 is a light-transmitting electrode, light emission is extracted through the second electrode 205. In the case where both the first electrode 201 and the second electrode 205 are light-transmitting electrodes, light emission is extracted through the first electrode 201 and the second electrode 205. A material that reflects light is preferably used as the electrode through which light is not extracted.

In addition, an insulating film such as an organic film, a transparent semiconductor film, or a silicon nitride film may be formed over the cathode (or an upper electrode). These films serve as passivation films and can suppress entry of impurities and moisture into the light-emitting element, or can reduce loss of light energy due to surface plasmon in the cathode.

<Light-Emitting Layer>

As already described above, the light-emitting layer of the light-emitting element in this embodiment includes an electron-transport compound that is a host material and a guest material. A host material is a material in which a guest material is dispersed. The light-emitting layer may further contain a material other than the guest material and the host material. For example, the light-emitting layer may contain, in addition to the electron-transport compound that is the host material and the guest material, an electron-transport compound, a hole-transport compound, or the like. In the present specification, a compound accounting for the largest proportion of the light-emitting layer is a host material in the light-emitting layer.

When the light-emitting layer has the structure in which the guest material is dispersed in the host material, the crystallization of the light-emitting layer can be inhibited. Further, concentration quenching due to high concentration of the guest material can be suppressed and thus the light-emitting element can have high emission efficiency.

Note that in the light-emitting element of one embodiment of the present invention, it is preferable that the light-emitting layer do not contain a hole-transport compound or that the light-emitting layer contain a hole-transport compound at 10 wt % or less because more energy of excitons generated in the vicinity of the interface between the hole-transport layer and the light-emitting layer or in the hole-transport layer can be utilized to make the guest material emit light, whereby the light-emitting element can have high emission efficiency.

Note that the $T_1$ level (the level of triplet excitation energy) of the host material (or a material other than the guest material in the light-emitting layer) is preferably higher than the $T_1$ level of the guest material. This is because, when the $T_1$ level of the host material is lower than that of the guest material, the triplet excitation energy of the guest material, which is to contribute to light emission, is quenched by the host material and accordingly the emission efficiency is decreased.

Examples of a phosphorescent compound that can be used as the guest material in the light-emitting layer 303 will be given below.

The following are examples of a phosphorescent compound emitting blue light: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), or tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium (III) (abbreviation: [Ir(Mptz1-mp)$_3$]) or tris(1-methyl-5-phenyl-3-propyl-1H-1,2,4-triazolato)iridium(III) (abbreviation: [Ir(Prptzl-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) or tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium (III) picolinate (abbreviation: [Ir(CF$_3$ ppy)$_2$(pic)]), or bis[2-(4',6'-difluorophenyl)pyridinato-N,C$^{2'}$]iridium(III) acetylacetonate (abbreviation: FIracac).

Among the materials given above, the organometallic iridium complex having a 4H-triazole skeleton has high reliability and high emission efficiency and is thus especially preferable.

The following are examples of a phosphorescent compound emitting green light: an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[4-(2-norbornyl)-6-phenylpyrimidinato]iridium(III) (endo- and exo-mixture) (abbreviation: [Ir(nbppm)$_2$(acac)]), (acetylacetonato)bis[5-methyl-6-(2-methylphenyl)-4-phenylpyrimidinato]iridium (III) (abbreviation: [Ir(mpmppm)$_2$(acac)]), or (acetylacetonato)bis(4,6-diphenylpyrimidinato)iridium(III) (abbreviation: [Ir(dppm)$_2$(acac)]); an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) or (acetylacetonato)bis(5-isopropyl-3-methyl-2-phenylpyrazinato)iridium(III) (abbreviation: [Ir(mppr-iPr)$_2$(acac)]); an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)₂(acac)]), bis(benzo[h]quinolinato)iridium(III) acetylacetonate (abbreviation: [Ir(bzq)₂(acac)]), tris(benzo[h]quinolinato)iridium(III) (abbreviation: [Ir(bzq)₃]), tris(2-phenylquinolinato-N,C²')iridium(III) (abbreviation: [Ir(pq)₃]), or bis(2-phenylquinolinato-N,C²')iridium(III) acetylacetonate (abbreviation: [Ir(pq)₂(acac)]); and a rare earth metal complex such as tris(acetylacetonato)(monophenanthroline)terbium(III) (abbreviation: [Tb(acac)₃(Phen)]).

Among the materials given above, the organometallic iridium complex having a pyrimidine skeleton has distinctively high reliability and distinctively high emission efficiency and is thus especially preferable.

The following are examples of a phosphorescent compound emitting red light: an organometallic iridium complex having a pyrimidine skeleton, such as (diisobutyrylmethanato)bis[4,6-bis(3-methylphenyl)pyrimidinato]iridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), or bis[4,6-di(naphthalen-1-yl)pyrimidinato](dipivaloylmethanato)iridium(III) (abbreviation: [Ir(d1npm)₂(dpm)]); an organometallic iridium complex having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(II) (abbreviation: [Ir(tppr)₂(dpm)]), or (acetylacetonato)bis[2,3-bis(4-fluorophenyl)quinoxalinato]iridium(III) (abbreviation: [Ir(Fdpq)₂(acac)]); an organometallic iridium complex having a pyridine skeleton, such as tris(1-phenylisoquinolinato-N,C²')iridium(III) (abbreviation: [Ir(piq)₃]) or bis(1-phenylisoquinolinato-N,C²')iridium(III) acetylacetonate (abbreviation: [Ir(piq)₂(acac)]); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: [Eu(DBM)₃(Phen)]) or tris[1-(2-thenoyl)-3,3,3-trifluoroacetonato](monophenanthroline)europium(III) (abbreviation: [Eu(TTA)₃(Phen)]).

Among the materials given above, the organometallic iridium complex having a pyrimidine skeleton has distinctively high reliability and distinctively high emission efficiency and is thus especially preferable. Further, because an organometallic iridium complex having a pyrazine skeleton can provide red light emission with favorable chromaticity, the use of the organometallic iridium complex in a white light-emitting element improves a color rendering property of the white light-emitting element.

Examples of a thermally activated delayed fluorescence material that can be used as the guest material in the light-emitting layer 303 will be given below.

Specific examples of the thermally activated delayed fluorescence materials include a fullerene, a derivative thereof, an acridine derivative such as proflavine, and eosin. Besides, a metal-containing porphyrin can be used, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: SnF₂(Proto IX)), a mesoporphyrin-tin fluoride complex (abbreviation: SnF₂(Meso IX)), a hematoporphyrin-tin fluoride complex (abbreviation: SnF₂(Hemato IX)), a coproporphyrin tetramethyl ester-tin fluoride complex (abbreviation: SnF₂(Copro III-4Me)), an octaethylporphyrin-tin fluoride complex (abbreviation: SnF₂(OEP)), an etioporphyrin-tin fluoride complex (abbreviation: SnF₂(Etio I)), and an octaethylporphyrin-platinum chloride complex (abbreviation: PtCl₂(OEP)). Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (abbreviation: PIC-TRZ). Note that a substance in which a π-electron rich heteroaromatic ring is directly bonded to a π-electron deficient heteroaromatic ring is particularly preferably used because the donor property of the π-electron rich heteroaromatic ring and the acceptor property of the π-electron deficient heteroaromatic ring are both increased and the difference between the S₁ level (the level of singlet excitation energy) and the T₁ level becomes small.

Examples of a fluorescent compound that can be used as the guest material in the light-emitting layer 303 will be given below.

Examples of the fluorescent compound include N,N'-bis[4-(9-phenyl-9H-fluoren-9-yl)phenyl]-N,N'-diphenylpyrene-1,6-diamine (abbreviation: 1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-antlhryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mnPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro- 1H,5H-benzo[i]quinolizin-9-yl)ethenyl]-4H-pyran-4-ylidene}propanedinitrile (abbreviation: BisDCJTM).

The electron-transport compound is a compound having a property of transporting more electrons than holes, and is especially preferably a compound with an electron mobility of $10^{-6}$ cm$^2$/Vs or more.

As the electron-transport compound, a π-electron deficient heteroaromatic compound such as a nitrogen-containing heteroaromatic compound, a metal complex having a quinoline skeleton or a benzoquinoline skeleton, a metal complex having an oxazole-based or thiazole-based ligand, or the like can be used.

Specific examples include the following: metal complexes such as bis(10-hydroxybenzo[h]quinolinato)beryllium (abbreviation: BeBq$_2$), bis(2-methyl-8-quinolinolato) (4-phenylphenolato)aluminum (abbreviation: BAlq), bis(8-quinolinolato)zinc(II) (abbreviation: Znq), bis[2-(2-hydroxyphenyl)benzoxazolato]zinc (abbreviation: Zn(BOX)$_2$), and bis[2-(2-hydroxyphenyl)benzothiazolato]zinc (abbreviation: Zn(BTZ)$_2$); heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), and 2-[3'-(9H-carbazol-9-yl)biphenyl-3-yl]dibenzo[f,h]quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]pyrimidine (abbreviation: 4,6mPnP2Pm), 4,6-bis[3-(9H-carbazol-9-yl)phenyl]pyrimidine (abbreviation: 4,6mCzP2Pm), and 4,6-bis[3-(4-dibenzothienyl)phenyl]pyrimidine (abbreviation: 4,6mDBTP2Pm-II); heterocyclic compounds having pyridine skeletons, such as 3,5-bis[3-(9H-carbazol-9-yl)phenyl]pyridine (abbreviation: 3,5DCzPPy), 1,3,5-tri[3-(3-pyridyl)phenyl]benzene (abbreviation: TmPyPB), and 3,3',5,5'-tetra[(m-pyridyl)-phen-3-yl]biphenyl (abbreviation: BP4mPy). Among the above-described compounds, the heterocyclic compounds having quinoxaline skeletons or dibenzoquinoxaline skeletons, the heterocyclic compounds having diazine (pyrimidine or pyrazine) skeletons, and the heterocyclic compounds having pyridine skeletons have high reliability and can be preferably used. Specifically, a heterocyclic compound having a diazine skeleton has a high electron-transport property to contribute to a reduction in drive voltage.

The following examples can also be given: metal complexes having quinoline skeletons or benzoquinoline skeletons, such as tris(8-quinolinolato)aluminum (abbreviation: Alq) and tris(4-methyl-8-quinolinolato)aluminum (abbreviation: Almq$_3$); and heteroaromatic compounds such as bathophenanthroline (abbreviation: BPhen), bathocuproine (abbreviation: BCP), 3-(4-tert-butylphenyl)-4-(4-ethylphenyl)-5-(4-biphenylyl)-1,2,4-triazole (abbreviation: p-EtTAZ), and 4,4'-bis(5-methylbenzoxazol-2-yl)stilbene (abbreviation: BzOs). In addition, high molecular compounds such as poly (2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can also be given.

<Hole-Transport Layer>

As already described above, the hole-transport layer of the light-emitting element in this embodiment includes a hole-transport compound and a phosphorescent compound or a thermally activated delayed fluorescence material.

As the phosphorescent compound or thermally activated delayed fluorescence material contained in the hole-transport layer, it is possible to use, for example, the substances given above as the examples of the phosphorescent compound and the thermally activated delayed fluorescence material that can be used for the light-emitting layer. Note that the phosphorescent compound or thermally activated delayed fluorescence material contained in the hole-transport layer is different from the guest material contained in the light-emitting layer. For the hole-transport layer, a compound whose emission spectrum has a peak on a shorter wavelength side than a peak of an emission spectrum of the guest material contained in the light-emitting layer is used.

Note that the phosphorescent compound or thermally activated delayed fluorescence material may be dispersed in the hole-transport compound in the entire hole-transport layer; alternatively, the phosphorescent compound or thermally activated delayed fluorescence material may be added to part of the hole-transport layer which is in the vicinity of the interface with the light-emitting layer.

The hole-transport compound is a compound with a property of transporting more holes than electrons, and is especially preferably a compound with a hole mobility of $10^{-6}$ cm$^2$/Vs or more.

As the hole-transport compound, a compound having an aromatic amine skeleton, a compound having a carbazole skeleton, a compound having a thiophene skeleton, a compound having a furan skeleton, or the like can be used. In particular, a π-electron rich heteroaromatic compound is preferable. A compound having an aromatic amine skeleton and a compound having a carbazole skeleton are preferable because these compounds are highly reliable and have high hole-transport properties to contribute to a reduction in drive voltage.

Specifically, the following examples can be given: 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(1-naphthyl)-N-(9-phenylcarbazol-3-yl)amino]-9-phenylcarbazole (abbreviation: PCzPCN1), 4,4',4"-tris[N-(1-naphthyl)-N-phenylamino]triphenylamine (abbreviation: 1'-TNATA), 2,7-bis[N-(4-diphenylaminophenyl)-N-phenylamino]spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N"-triphenyl-N,N',N"-tris(9-phenylcarbazol-3-yl)benzene-1,3,5-triamine (abbreviation: PCA3B), 2-[N-(9- phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), and 3,6-bis[N-(4-diphenylaminophenyl)-N-(1-naphthyl)amino]-9-phenylcarbazole (abbreviation: PCzTPN2).

The following examples can also be given: aromatic amine compounds such as 4,4'-bis[N-(1-naphthyl)-N-phenylamino]biphenyl (abbreviation: NPB or α-NPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4,4',4"-tris(N-carbazolyl)triphenylamine (abbreviation: TCTA), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), and 4,4'-bis[N-(9,9-dimethylfluoren-2-yl)-N-phenylamino]biphenyl (abbreviation: DFLDPBi); and carbazole derivatives such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), CzPA, and PCzPA. In addition, high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD) can be given.

As other examples, compounds having thiophene skeletons, such as 4,4',4"-(1,3,5-benzenetriyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), and compounds having furan skeletons, such as 4,4',4"-(1,3,5-benzenetriyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II) can be given.

<Electron-Transport Layer>

The electron-transport layer 304 contains an electron-transport substance.

The electron-transport substance is a substance having a property of transporting more electrons than holes, and is especially preferably a substance with an electron mobility of $10^{-6}$ cm$^2$/Vs or more.

For the electron-transport layer 304, it is possible to use any of the electron-transport compounds that are described as examples of the substance applicable to the light-emitting layer.

<Hole-Injection Layer>

The hole-injection layer 301 is a layer containing a hole-injection substance.

Examples of the hole-injection substance include metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

Alternatively, a phthalocyanine-based compound such as phthalocyanine (abbreviation: H$_2$Pc) or copper(II) phthalocyanine (abbreviation: CuPc) can be used.

Further alternatively, it is possible to use an aromatic amine compound such as TDATA, MTDATA, DPAB, DNTPD, 1,3,5-tris[N-(4-diphenylaminophenyl)-N-phenylamino]benzene (abbreviation: DPA3B), PCzPCA1, PCzPCA2, or PCzPCN1.

Further alternatively, it is possible to use a high molecular compound such as PVK, PVTPA, PTPDMA, or Poly-TPD, or a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS).

The hole-injection layer 301 may serve as the charge-generation region. When the hole-injection layer 301 in contact with the anode serves as the charge-generation region, any of a variety of conductive materials can be used for the anode regardless of their work functions. Materials contained in the charge-generation region will be described later.

<Electron-Injection Layer>

The electron-injection layer 305 contains an electron-injection substance.

Examples of the electron-injection substance include an alkali metal, an alkaline earth metal, a rare earth metal, and a compound thereof (e.g., an oxide thereof, a carbonate thereof, and a halide thereof), such as lithium, cesium, calcium, lithium oxide, lithium carbonate, cesium carbonate, lithium fluoride, cesium fluoride, calcium fluoride, and erbium fluoride.

The electron-injection layer 305 may serve as the charge-generation region. When the electron-injection layer 305 in contact with the cathode serves as the charge-generation region, any of a variety of conductive materials can be used for the cathode regardless of their work functions. Materials contained in the charge-generation region will be described later.

<Charge-Generation Region>

The charge-generation region included in a hole-injection layer, an electron-injection layer, an intermediate layer, or the like may have either a structure in which an electron acceptor (acceptor) is added to a hole-transport substance or a structure in which an electron donor (donor) is added to an electron-transport substance. Alternatively, these structures may be stacked.

The hole-transport compounds and the electron-transport compounds which are described as examples of the substance that can be used for a light-emitting layer can be given as the hole-transport substance and the electron-transport substance.

Further, as the electron acceptor, 7,7,8,8-tetracyano-2,3,5,6-tetrafluoroquinodimethane (abbreviation: F$_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable because it is stable in the air, has a low hygroscopic property, and is easily handled.

Further, as the electron donor, it is possible to use an alkali metal, an alkaline earth metal, a rare earth metal, a metal belonging to Group 13 of the periodic table, or an oxide or a carbonate thereof. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

The above-described layers included in the EL layer 203 and the intermediate layer 207 can be formed by any of the following methods: an evaporation method (including a vacuum evaporation method), a transfer method, a printing method, an inkjet method, a coating method, and the like.

A light-emitting element in this embodiment can be fabricated over a substrate of glass, plastic, or the like. As the way of stacking layers over the substrate, layers may be sequentially stacked from the first electrode 201 side or sequentially stacked from the second electrode 205 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the driving of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

With the use of a light-emitting element described in this embodiment, a passive matrix light-emitting device or an active matrix light-emitting device in which driving of the light-emitting element is controlled by a transistor can be manufactured. Furthermore, the light-emitting device can be applied to an electronic device, a lighting device, or the like.

The above-described light-emitting element of one embodiment of the present invention has high emission efficiency and a long lifetime.

This embodiment can be freely combined with any of other embodiments.

Embodiment 2

In this embodiment, light-emitting devices of embodiments of the present invention will be described with reference to FIGS. 2A and 2B and FIGS. 3A to 3C. The light-emitting device in this embodiment includes the light-emitting element of one embodiment of the present invention. Since the light-emitting element has high emission efficiency, a light-emitting device with low power consumption can be provided.

Figure 2A:
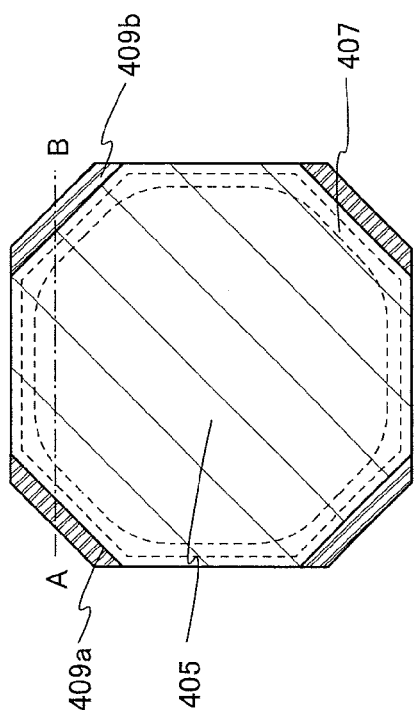
FIGS. 2A and 2B illustrate an example of a light-emitting device of one embodiment of the present invention.
Figure 2B:
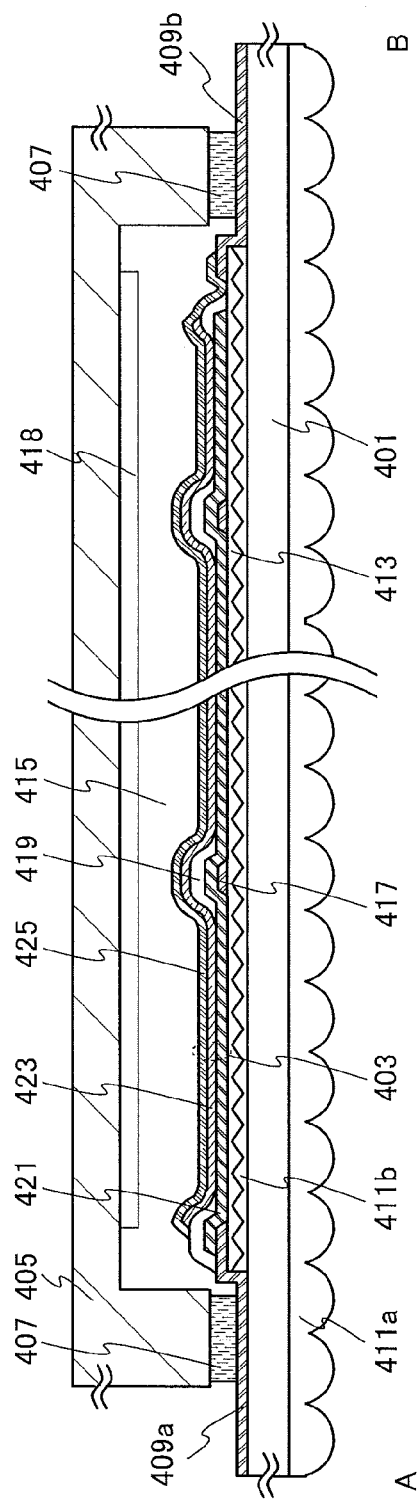

FIG. 2A is a plan view of a light-emitting device of one embodiment of the present invention, and FIG. 2B is a cross-sectional view taken along dashed-dotted line A-B in FIG. 2A.

In the light-emitting device in this embodiment, a light-emitting element 403 is provided in a space 415 surrounded by a support substrate 401, a sealing substrate 405, and a sealing material 407. The light-emitting element 403 is a light-emitting element having a bottom-emission structure; specifically, a first electrode 421 which transmits visible light is provided over the support substrate 401, an EL layer 423 is provided over the first electrode 421, and a second electrode 425 is provided over the EL layer 423. The light-emitting element 403 is a light-emitting element to which one embodiment of the present invention in Embodiment 1 is applied. The sealing substrate 405 includes a drying agent 418 on the light-emitting element 403 side.

A first terminal 409a is electrically connected to an auxiliary wiring 417 and the first electrode 421. An insulating layer 419 is provided over the first electrode 421 in a region which overlaps with the auxiliary wiring 417. The first terminal 409a is electrically insulated from the second electrode 425 by the insulating layer 419. A second terminal 409b is electrically connected to the second electrode 425. Note that although the first electrode 421 is formed over the auxiliary wiring 417 in this embodiment, the auxiliary wiring 417 may be formed over the first electrode 421.

A light extraction structure 411a is preferably provided at the interface between the support substrate 401 and the atmosphere. When provided at the interface between the support substrate 401 and the atmosphere, the light extraction structure 411a can reduce light which cannot be extracted to the atmosphere due to total reflection, resulting in an increase in the light extraction efficiency of the light-emitting device.

In addition, a light extraction structure 411b is preferably provided at the interface between the light-emitting element 403 and the support substrate 401. When the light extraction structure 411b has unevenness, a planarization layer 413 is preferably provided between the light extraction structure 411b and the first electrode 421. Accordingly, the first electrode 421 can be a flat film, and generation of leakage current in the EL layer 423 due to the unevenness of the first electrode 421 can be prevented. Further, because of the light extraction structure 411b at the interface between the planarization layer 413 and the support substrate 401, light which cannot be extracted to the atmosphere due to total reflection can be reduced, so that the light extraction efficiency of the light-emitting device can be increased.

The surface of the planarization layer 413 which is in contact with the first electrode 421 is flatter than the surface of the planarization layer 413 which is in contact with the light extraction structure 411b. As a material of the planarization layer 413, glass, a resin, or the like having a light-transmitting property and a high refractive index can be used.

Figure 3A:
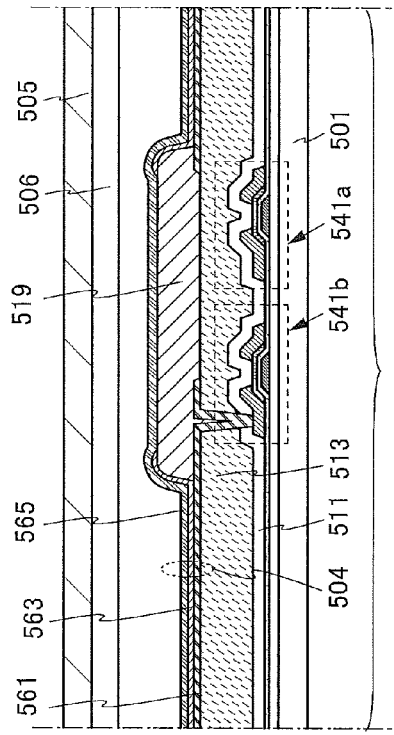
FIGS. 3A to 3C illustrate examples of a light-emitting device of one embodiment of the present invention.
Figure 3C:
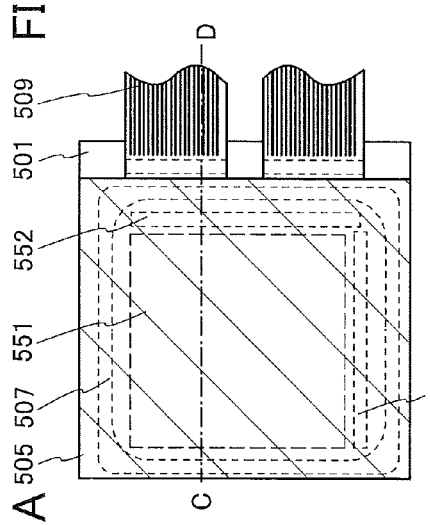
Figure 3B:
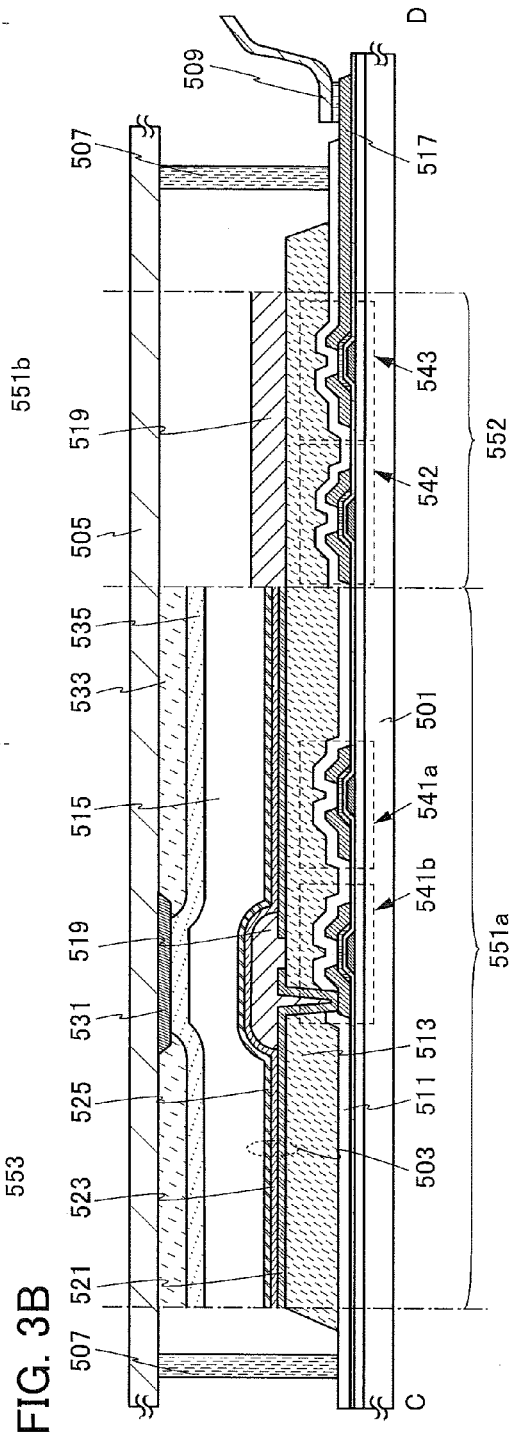

FIG. 3A is a plan view of a light-emitting device of one embodiment of the present invention, FIG. 3B is a cross-sectional view taken along dashed-dotted line C-D in FIG. 3A, and FIG. 3C is a cross-sectional view illustrating a modified example of the light-emitting portion.

An active matrix light-emitting device in this embodiment includes, over a support substrate 501, a light-emitting portion 551 (the cross section of which is illustrated in FIG. 3B and FIG. 3C as a light-emitting portion 551a and a light-emitting portion 551b, respectively), a driver circuit portion 552 (gate side driver circuit portion), a driver circuit portion 553 (source side driver circuit portion), and a sealing material 507. The light-emitting portion 551 and the driver circuit portions 552 and 553 are sealed in a space 515 surrounded by the support substrate 501, a sealing substrate 505, and the sealing material 507.

Any of a separate coloring method, a color filter method, and a color conversion method can be applied to the light-emitting device of one embodiment of the present invention. The light-emitting portion 551a fabricated by a color filter method is illustrated in FIG. 3B, and the light-emitting portion 551b fabricated by a separate coloring method is illustrated in FIG. 3C.

Each of the light-emitting portion 551a and the light-emitting portion 551b includes a plurality of light-emitting units each including a switching transistor 541a, a current control transistor 541b, and a first electrode 521 electrically connected to a wiring (a source electrode or a drain electrode) of the current control transistor 541b.

A light-emitting element 503 included in the light-emitting portion 551a has a bottom-emission structure and includes the first electrode 521 which transmits visible light, an EL layer 523, and a second electrode 525. A partition 519 is formed so as to cover an end portion of the first electrode 521.

A light-emitting element 504 included in the light-emitting portion 551b has a top-emission structure and includes a first electrode 561, an EL layer 563, and a second electrode 565 which transmits visible light. The partition 519 is formed so as to cover an end portion of the first electrode 561. In the EL layer 563, at least layers (e.g., light-emitting layers) which contain different materials depending on the light-emitting element are colored separately.

Over the support substrate 501, a lead wiring 517 for connecting an external input terminal through which a signal (e.g., a video signal, a clock signal, a start signal, or a reset signal) or a potential from the outside is transmitted to the driver circuit portion 552 or 553 is provided. Here, an example is described in which a flexible printed circuit (FPC) 509 is provided as the external input terminal.

The driver circuit portions 552 and 553 include a plurality of transistors. FIG. 3B illustrates two of the transistors in the driver circuit portion 552 (transistors 542 and 543).

To prevent an increase in the number of manufacturing steps, the lead wiring 517 is preferably formed using the same material and the same step(s) as those of the electrode or the wiring in the light-emitting portion or the driver circuit portion. Described in this embodiment is an example in which the lead wiring 517 is formed using the same material and the same step(s) as those of the source electrodes and the drain electrodes of the transistors included in the light-emitting portion 551 and the driver circuit portion 552.

In FIG. 3B, the sealing material 507 is in contact with a first insulating layer 511 over the lead wiring 517. The adhesion of the sealing material 507 to metal is low in some cases. Therefore, the sealing material 507 is preferably in contact with an inorganic insulating film over the lead wiring 517. Such a structure enables a light-emitting device to have high sealing capability, high adhesion, and high reliability. Examples of the inorganic insulating film include oxide films of metals and semiconductors, nitride films of metals and semiconductors, and oxynitride films of metals and semiconductors, and specifically, a silicon oxide film, a silicon nitride film, a silicon oxynitride film, a silicon nitride oxide film, an aluminum oxide film, a titanium oxide film, and the like.

The first insulating layer 511 has an effect of preventing diffusion of impurities into a semiconductor included in the transistor. As the second insulating layer 513, an insulating film having a planarization function is preferably selected in order to reduce surface unevenness due to the transistor.

The sealing substrate 505 illustrated in FIG. 3B is provided with a color filter 533 as a coloring layer at a position overlapping with the light-emitting element 503 (a light-emitting region thereof), and is also provided with a black matrix 531 at a position overlapping with the partition 519. Further, an overcoat layer 535 is provided so as to cover the color filter 533 and the black matrix 531. The sealing substrate 505 illustrated in FIG. 3C is provided with a desiccant 506.

Examples of materials that can be used for the light-emitting device of one embodiment of the present invention will be described.

[Substrate]

The substrate on the side from which light from the light-emitting element is extracted is formed using a material which transmits the light. For example, a material such as glass, quartz, ceramics, sapphire, or an organic resin can be used. The substrate of a flexible light-emitting device is formed using a flexible material.

As the glass, for example, non-alkali glass, barium borosilicate glass, aluminoborosilicate glass, or the like can be used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus a light-emitting device using this substrate can also be lightweight.

Furthermore, since the substrate through which light emission is not extracted does not need to have a light-transmitting property, a metal substrate using a metal material or an alloy material or the like can be used in addition to the above-mentioned substrates. A metal material and an alloy material, which have high thermal conductance, are preferred in that they can easily conduct heat into the whole sealing substrate and accordingly can reduce a local rise in the temperature of the light-emitting device. To obtain flexibility and bendability, the thickness of a metal substrate is preferably greater than or equal to 10 μm and less than or equal to 200 μm, further preferably greater than or equal to 20 μm and less than or equal to 50 μm.

There is no particular limitation on a material of the metal substrate, but it is preferable to use, for example, aluminum, copper, nickel, a metal alloy such as an aluminum alloy or stainless steel.

It is possible to use a substrate subjected to insulation treatment in such a manner that a surface of the conductive substrate is oxidized or an insulating film is formed on the surface. An insulating film may be formed by, for example, a coating method such as a spin-coating method and a dipping method, an electrodeposition method, an evaporation method, or a sputtering method. An oxide film may be formed over the substrate surface by an anodic oxidation method, exposing to or heating in an oxygen atmosphere, or the like.

The flexible substrate may have a stacked structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in lifetime of the light-emitting element due to moisture and the like, an insulating film with low water permeability may be provided. For example, a film containing nitrogen and silicon (e.g., a silicon nitride film, a silicon oxynitride film), or a film containing nitrogen and aluminum (e.g., an aluminum nitride film) may be provided.

The substrate may be formed by stacking a plurality of layers. When a glass layer is used, a barrier property against water and oxygen can be improved and thus a reliable light-emitting device can be provided.

For example, a substrate in which a glass layer, a bonding layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and flexibility. The thickness of the organic resin layer is greater than or equal to 10 μm and less than or equal to 200 μm, preferably greater than or equal to 20 μm and less than or equal to 50 μm. By providing such an organic resin layer on an outer side than the glass layer, occurrence of a crack or a break in the glass layer can be suppressed and mechanical strength can be improved. With the substrate that includes such a composite material of a glass material and an organic resin, a highly reliable and flexible light-emitting device can be provided.

[Insulating Film]

An insulating film may be provided between the supporting substrate and the light-emitting element or between the supporting substrate and the transistor. The insulating film can be formed using an inorganic insulating material such as silicon oxide, silicon nitride, silicon oxynitride, or silicon nitride oxide. In order to suppress entry of moisture or the like into the transistor and the light-emitting element, it is particularly preferable to use an insulating film with low water permeability such as a silicon oxide film, a silicon nitride film, or an aluminum oxide film. For a similar purpose and with a similar material, an insulating film covering the transistor and the light-emitting element may be provided.

[Light-Emitting Element]

The light-emitting device of one embodiment of the present invention includes at least one light-emitting element described in Embodiment 1.

[Partition]

For the partition, an organic resin or an inorganic insulating material can be used. As the organic resin, for example, a polyimide resin, a polyamide resin, an acrylic resin, a siloxane resin, an epoxy resin, a phenol resin, or the like can be used. As the inorganic insulating material, silicon oxide, silicon oxynitride, or the like can be used. In particular, a photosensitive resin is preferably used for easy formation of the partition.

There is no particular limitation on the method for forming the partition. A photolithography method, a sputtering method, an evaporation method, a droplet discharging method (e.g., an inkjet method), a printing method (e.g., a screen printing method or an offset printing method), or the like can be used.

[Auxiliary Wiring]

An auxiliary wiring is not necessarily provided; however, an auxiliary wiring is preferably provided because voltage drop due to the resistance of an electrode can be prevented.

For a material of the auxiliary wiring, a single layer or a stacked layer using a material selected from copper (Cu), titanium (Ti), tantalum (Ta), tungsten (W), molybdenum (Mo), chromium (Cr), neodymium (Nd), scandium (Sc), and nickel (Ni) or an alloy material including any of these materials as its main component is used. Aluminum can also be used as the material of the auxiliary wiring. When the auxiliary wiring of aluminum is provided to be in direct contact with a transparent oxide conductive material, aluminum might corrode; thus, in order to prevent corrosion, it is preferable that the auxiliary wiring have a stacked-layer structure and aluminum be used for a layer thereof which is not in contact with ITO or the like. The thickness of the auxiliary wiring can be greater than or equal to 0.1 μm and less than or equal to 3 μm, preferably greater than or equal to 0.1 μm and less than or equal to 0.5 μm.

When a paste (e.g., silver paste) is used as the material of the auxiliary wiring, a metal forming the auxiliary wiring aggregates in the form of particles, and as a result, the surface of the auxiliary wiring becomes rough and has many gaps. This makes it difficult for the EL layer to cover the auxiliary wiring completely, which is provided over the insulating layer 419, for example; accordingly, the upper electrode and the auxiliary wiring are easily connected electrically to each other, which is preferable.

[Sealing Material]

A method for sealing the light-emitting device is not limited, and either solid sealing or hollow sealing can be employed. For example, a glass material such as a glass frit, or a resin material such as a two-component-mixture-type resin which is curable at room temperature, a light curable resin, or a thermosetting resin can be used. The light-emitting device may be filled with an inert gas such as nitrogen or argon, or a resin such as a polyvinyl chloride (PVC) resin, an acrylic resin, a polyimide resin, an epoxy resin, a silicone resin, a polyvinyl butyral (PVB) resin, or an ethylene vinyl acetate (EVA) resin. Further, a drying agent may be contained in the resin.

[Light Extraction Structure]

For the light extraction structure, a hemispherical lens, a micro lens array, a film provided with an uneven surface structure, a light diffusing film, or the like can be used. For example, a light extraction structure can be formed by attaching the lens or film to the substrate with an adhesive or the like which has substantially the same refractive index as the substrate or the lens or film.

[Transistor]

The light-emitting device of one embodiment of the present invention may include a transistor. The structure of the transistor is not limited: a top-gate transistor may be used, or a bottom-gate transistor such as an inverted staggered transistor may be used. An n-channel transistor may be used and a p-channel transistor may also be used. In addition, there is no particular limitation on a material used for the transistor. For example, a transistor in which silicon or an oxide semiconductor such as an In—Ga—Zn-based metal oxide is used in a channel formation region can be employed.

This embodiment can be combined with any of other embodiments, as appropriate.

Embodiment 3

In this embodiment, examples of electronic devices and lighting devices to which the light-emitting device of one embodiment of the present invention is applied will be described with reference to FIGS. 4A to 4E and FIGS. 5A and 5B.

Electronic devices in this embodiment each include the light-emitting device of one embodiment of the present invention in a display portion. Lighting devices in this embodiment each include the light-emitting device of one embodiment of the present invention in a light-emitting portion (a lighting portion). Electronic devices and lighting devices with low power consumption can be provided by adopting the light-emitting device of one embodiment of the present invention.

Examples of electronic devices to which the light-emitting device is applied are television devices (also referred to as TV or television receivers), monitors for computers and the like, cameras such as digital cameras and digital video cameras, digital photo frames, cellular phones (also referred to as mobile phones or portable telephone devices), portable game machines, portable information terminals, audio playback devices, large game machines such as pin-ball machines, and the like. Specific examples of these electronic devices and lighting devices are illustrated in FIGS. 4A to 4E and FIGS. 5A and 5B.

Figure 4A:
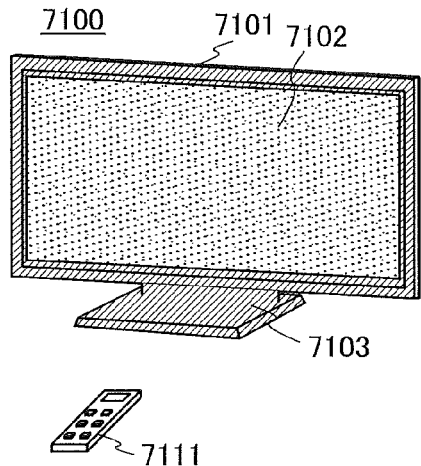
FIGS. 4A to 4E each illustrate an example of an electronic device of one embodiment of the present invention.

FIG. 4A illustrates an example of a television device. In a television device 7100, a display portion 7102 is incorporated in a housing 7101. The display portion 7102 is capable of displaying images. The light-emitting device of one embodiment of the present invention can be used for the display portion 7102. In addition, here, the housing 7101 is supported by a stand 7103.

The television device 7100 can be operated with an operation switch provided in the housing 7101 or a separate remote controller 7111. With operation keys of the remote controller 7111, channels and volume can be controlled and images displayed on the display portion 7102 can be controlled. The remote controller 7111 may be provided with a display portion for displaying data output from the remote controller 7111.

Note that the television device 7100 is provided with a receiver, a modem, and the like. With the use of the receiver, general television broadcasting can be received. Moreover, when the television device is connected to a communication network with or without wires via the modem, one-way (from a transmitter to a receiver) or two-way (between a transmitter and a receiver or between receivers) information communication can be performed.

Figure 4B:
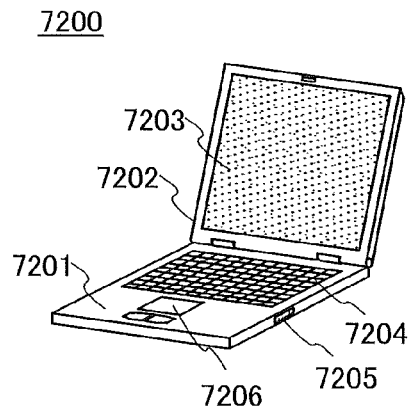

FIG. 4B illustrates an example of a computer. A computer 7200 includes a main body 7201, a housing 7202, a display portion 7203, a keyboard 7204, an external connection port 7205, a pointing device 7206, and the like. Note that this computer is manufactured by using the light-emitting device of one embodiment of the present invention for the display portion 7203.

Figure 4C:
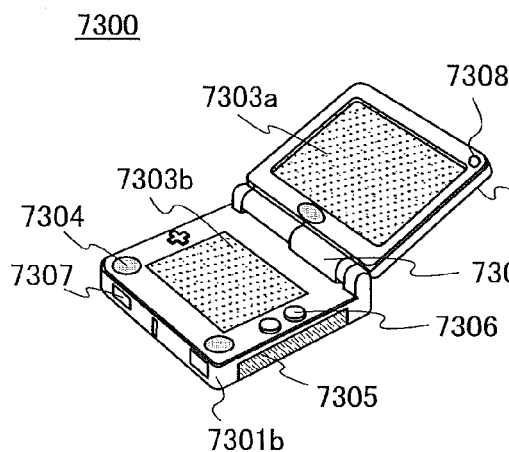

FIG. 4C illustrates an example of a portable game machine. A portable game machine 7300 has two housings, a housing 7301a and a housing 7301b, which are connected with a joint portion 7302 so that the portable game machine can be opened or closed. The housing 7301a incorporates a display portion 7303a, and the housing 7301b incorporates a display portion 7303b. In addition, the portable game machine illustrated in FIG. 4C includes a speaker portion 7304, a recording medium insertion portion 7305, an operation key 7306, a connection terminal 7307, a sensor 7308 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), an LED lamp, a microphone, and the like. It is needless to say that the structure of the portable game machine is not limited to the above structure as long as the light-emitting device of one embodiment of the present invention is used for at least either the display portion 7303a or the display portion 7303b, or both, and may include other accessories as appropriate. The portable game machine illustrated in FIG. 4C has a function of reading out a program or data stored in a recoding medium to display it on the display portion, and a function of sharing information with another portable game machine by wireless communication. Note that functions of the portable game machine illustrated in FIG. 4C are not limited to them, and the portable game machine can have various functions.

Figure 4D:
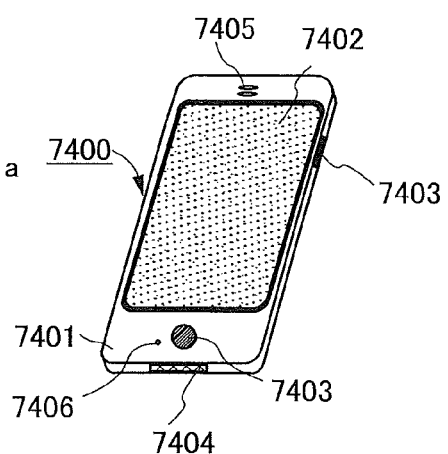

FIG. 4D illustrates an example of a cellular phone. A cellular phone 7400 is provided with a display portion 7402 incorporated in a housing 7401, an operation button 7403, an external connection port 7404, a speaker 7405, a microphone 7406, and the like. Note that the cellular phone 7400 is manufactured by using the light-emitting device of one embodiment of the present invention for the display portion 7402.

When the display portion 7402 of the cellular phone 7400 illustrated in FIG. 4D is touched with a finger or the like, data can be input into the cellular phone. Further, operations such as making a call and creating e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating e-mail, an input mode mainly for inputting characters is selected for the display portion 7402 so that characters displayed on the screen can be input.

When a sensing device including a sensor such as a gyroscope sensor or an acceleration sensor for detecting inclination is provided inside the cellular phone 7400, display on the screen of the display portion 7402 can be automatically changed in direction by determining the orientation of the cellular phone 7400 (whether the cellular phone 7400 is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by the display portion 7402 while in touch with the palm or the finger, whereby personal authentication can be performed. Further, when a backlight or a sensing light source which emits near-infrared light is provided in the display portion, an image of a finger vein, a palm vein, or the like can be taken.

Figure 4E:
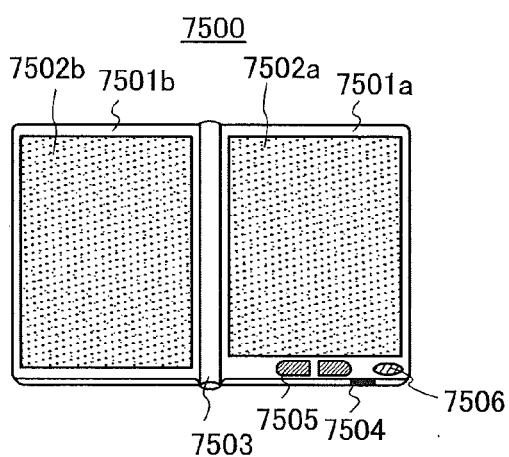

FIG. 4E illustrates an example of a foldable tablet terminal (in an open state). A tablet terminal 7500 includes a housing 7501a, a housing 7501b, a display portion 7502a, and a display portion 7502b. The housing 7501a and the housing 7501b are connected by a hinge 7503 and can be opened and closed using the hinge 7503 as an axis. The housing 7501a includes a power switch 7504, operation keys 7505, a speaker 7506, and the like. Note that the tablet terminal 7500 is manufactured by using the light-emitting device of one embodiment of the present invention for either the display portion 7502a or the display portion 7502b, or both.

At least part of the display portion 7502a or the display portion 7502b can be used as a touch panel region, where data can be input by touching displayed operation keys. For example, a keyboard can be displayed on the entire region of the display portion 7502a so that the display portion 7502a is used as a touch panel, and the display portion 7502b can be used as a display screen.

Figure 5A:
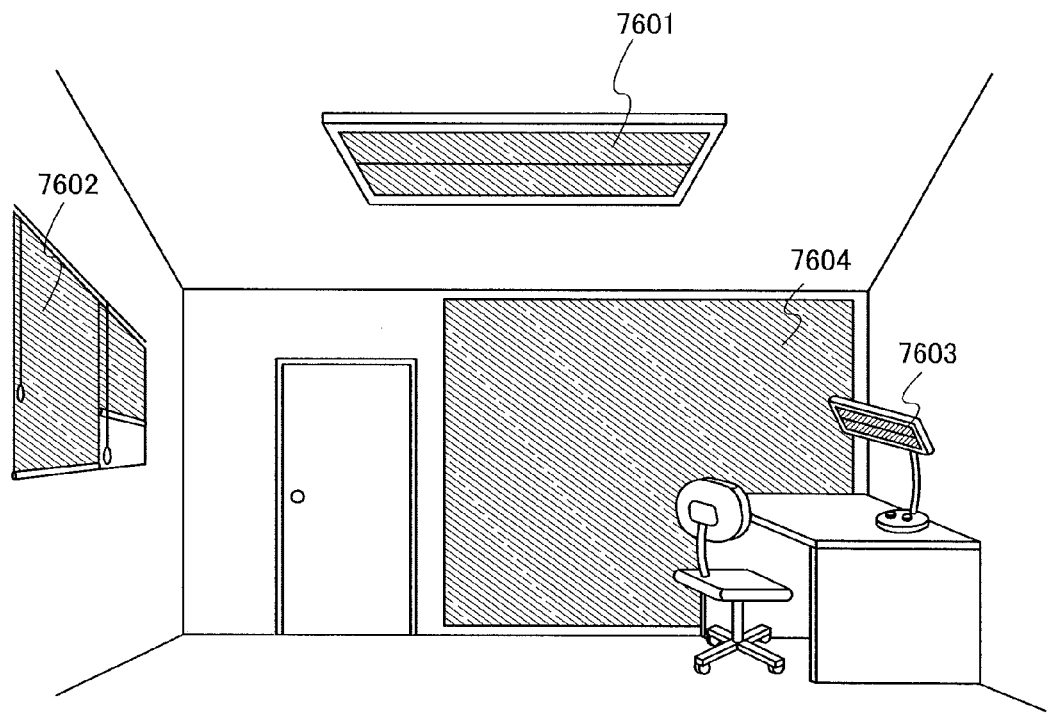
FIGS. 5A and 5B illustrate examples of lighting devices of embodiments of the present invention.

An indoor lighting device 7601, a roll-type lighting device 7602, a desk lamp 7603, and a planar lighting device 7604 illustrated in FIG. 5A are each an example of a lighting device which includes the light-emitting device of one embodiment of the present invention. Since the light-emitting device of one embodiment of the present invention can have a larger area, it can be used as a large-area lighting device. Further, since the light-emitting device of one embodiment of the present invention is thin, the light-emitting device can be mounted on a wall.

Figure 5B:
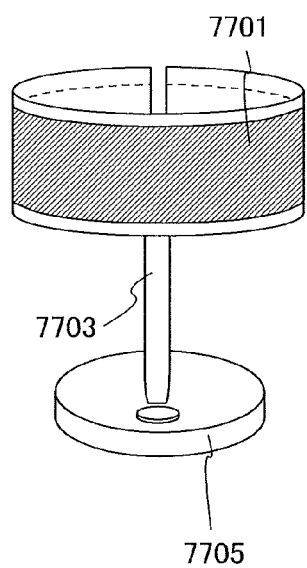

A desk lamp illustrated in FIG. 5B includes a lighting portion 7701, a support 7703, a support base 7705, and the like. The light-emitting device of one embodiment of the present invention is used for the lighting portion 7701. In one embodiment of the present invention, a lighting device whose light-emitting portion has a curved surface or a lighting device including a flexible lighting portion can be obtained. Such use of a flexible light-emitting device for a lighting device enables a place having a curved surface, such as a ceiling or a dashboard of a motor vehicle, to be provided with the lighting device, as well as increases the degree of freedom in design of the lighting device.

This embodiment can be combined with any of other embodiments, as appropriate.

Example 1

Figure 6:
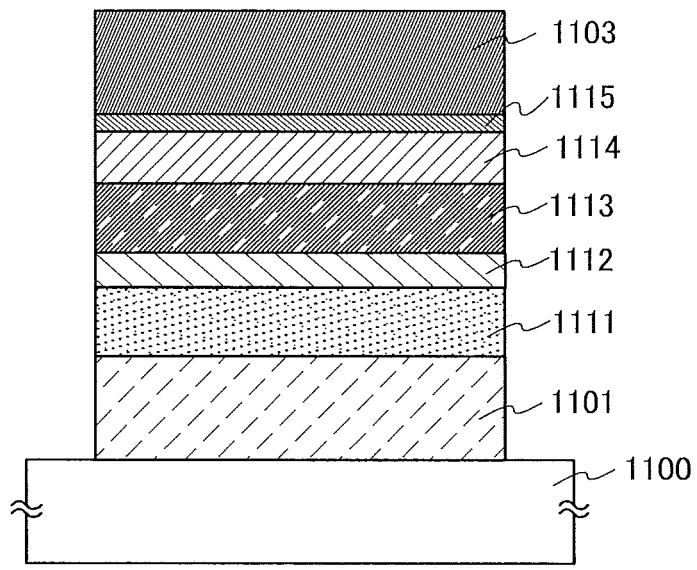
FIG. 6 shows a light-emitting element in Examples.

In this example, light-emitting elements of embodiments of the present invention will be described with reference to FIG. 6. Chemical formulae of materials used in this example are shown below.

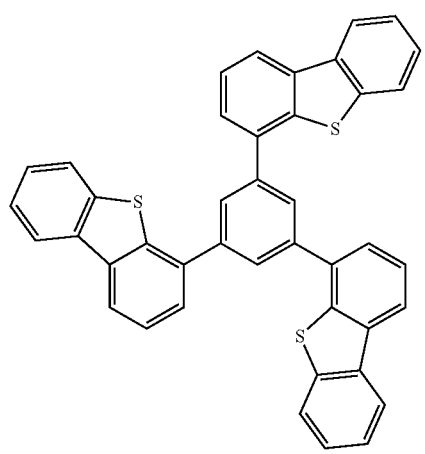

DBT3P-II

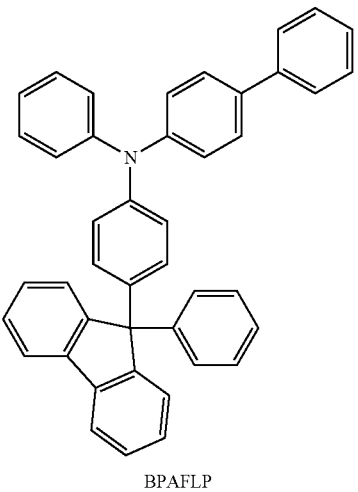

BPAFLP

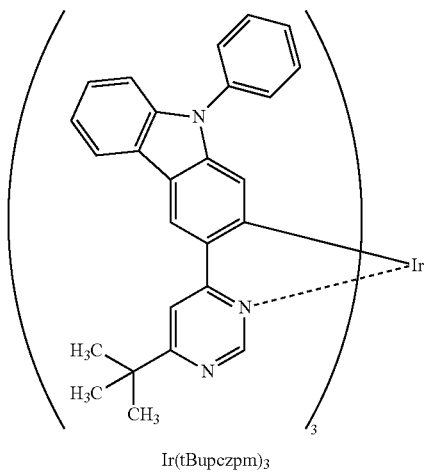

Ir(tBupczpm)₃

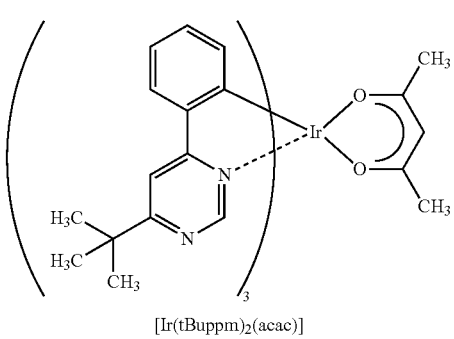

[Ir(tBuppm)₂(acac)]

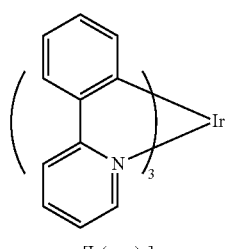

[Ir(ppy)₃]

-continued

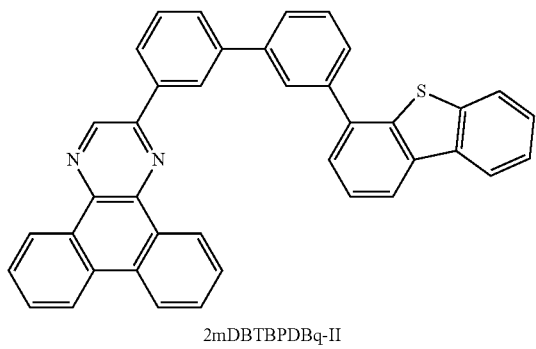

2mDBTBPDBq-II

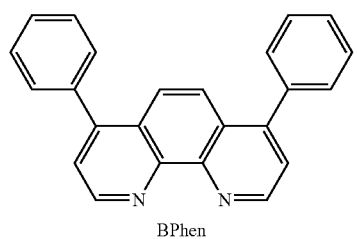

BPhen

Methods for manufacturing a light-emitting element 1, a light-emitting element 2, a comparative light-emitting element 3, and a comparative light-emitting element 4 of this example will be described below.

(Light-Emitting Element 1)

A film of indium tin oxide containing silicon (ITSO) was formed over a glass substrate 1100 by a sputtering method, so that a first electrode 1101 functioning as an anode was formed. Note that the thickness was set to 110 nm and the electrode area was set to 2 mm×2 mm.

Then, as pretreatment for forming the light-emitting element over the glass substrate 1100, UV ozone treatment was performed for 370 seconds after washing a surface of the glass substrate 1100 with water and baking the substrate at 200° C. for 1 hour.

After that, the glass substrate 1100 was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate 1100 was cooled down for approximately 30 minutes.

Then, the glass substrate 1100 over which the first electrode 1101 was formed was fixed to a substrate holder provided in the vacuum evaporation apparatus so that the surface on which the first electrode 1101 was formed faced downward. The pressure in the vacuum evaporation apparatus was reduced to approximately $10^{-4}$ Pa. After that, over the first electrode 1101, 4,4',4''-(1,3,5-benzenetriyl)tri(dibenzothiophene) (abbreviation: DBT3P-II) and molybdenum (VI) oxide were deposited by co-evaporation, so that a hole-injection layer 1111 was formed. The thickness of the hole-injection layer 1111 was set to 40 nm, and the weight ratio of DBT3P-II to molybdenum oxide was adjusted to 2:1. Note that the co-evaporation method refers to an evaporation method in which evaporation is carried out from a plurality of evaporation sources at the same time in one treatment chamber.

Next, 4-phenyl-4'-(9-phenylfluoren-9-yl)triphenylamine (abbreviation: BPAFLP) and tris(2-phenylpyridinato-N,C$^{2'}$) iridium(III) (abbreviation: [Ir(ppy)$_3$]) were deposited by co-evaporation over the hole-injection layer 1111 to form a hole-transport layer 1112. The thickness was set to 20 nm and the weight ratio of BPAFLP to [Ir(ppy)$_3$] was adjusted to 1:0.02.

Next, 2-[3'-(dibenzothiophen-4-yl)biphenyl-3-yl]dibenzo[f,h]quinoxaline (abbreviation: 2mDBTBPDBq-II) and (acetylacetonato)bis(6-tert-butyl-4-phenylpyrimidinato)iridium(III) (abbreviation: [Ir(tBuppm)$_2$(acac)]) were deposited by co-evaporation, whereby a light-emitting layer 1113 was formed over the hole-transport layer 1112. The weight ratio of 2mDBTBPDBq-II to [Ir(tBuppm)$_2$(acac)] was adjusted to 1:0.05. The thickness of the light-emitting layer 1113 was set to 40 nm.

Next, a film of 2mDBTBPDBq-II was formed to a thickness of 15 nm over the light-emitting layer 1113 and then a film of bathophenanthroline (abbreviation: BPhen) was formed to a thickness of 10 nm, so that an electron-transport layer 1114 was formed.

After that, over the electron-transport layer 1114, lithium fluoride (LiF) was deposited by evaporation to a thickness of 1 nm to form an electron-injection layer 1115.

Lastly, aluminum was deposited by evaporation to a thickness of 200 nm to form a second electrode 1103 functioning as a cathode. Thus, the light-emitting element 1 of this example was fabricated.

Note that in all the above evaporation steps, evaporation was performed by a resistance-heating method.

(Light-Emitting Element 2)

The hole-transport layer 1112 of the light-emitting element 2 was formed by co-depositing BPAFLP and tris [3-(6-tert-butyl-4-pyrimidinyl-κN3)-9-phenyl-9H-carbazol-2-yl-κC] iridium(III) (abbreviation: [Ir(tBupczpm)$_3$]) by evaporation. Here, the weight ratio of BPAFLP to [Ir(tBupczpm)$_3$] was adjusted to 1:0.02. The thickness of the hole-transport layer 1112 was set to 20 nm. The components other than the hole-transport layer 1112 were formed in the same way as in the light-emitting element 1.

(Comparative Light-Emitting Element 3)

The hole-transport layer 1112 of the comparative light-emitting element 3 was formed by forming a film of BPAFLP to a thickness of 20 nm. The components other than the hole-transport layer 1112 were formed in the same way as in the light-emitting element 1.

(Comparative Light-Emitting Element 4)

The hole-transport layer 1112 of the comparative light-emitting element 4 was formed by co-depositing BPAFLP and [Ir(tBuppm)$_2$(acac)] by evaporation. Here, the weight ratio of BPAFLP to [Ir(tBuppm)$_2$(acac)] was adjusted to 1:0.02. The thickness of the hole-transport layer 1112 was set to 20 nm. The components other than the hole-transport layer 1112 were formed in the same way as in the light-emitting element 1.

Table 1 shows the element structures of the light-emitting elements of this example, which were fabricated in the above manners.

TABLE 1

| | First Electrode | Hole-injection Layer | Hole-transport Layer | Light-emitting Layer | Electron-transport Layer | | Electron-injection Layer | Second Electrode |
|---|---|---|---|---|---|---|---|---|
| Light-emitting Element 1 | ITSO 110 nm | DBT3P-II: MoO$_x$ (=2:1) 20 nm | BPAFLP: [Ir(ppy)$_3$] (=1:0.02) 20 nm | 2mDBTBPDBq-II: [Ir(tBuppm)$_2$(acac)] (=1:0.05) 40 nm | 2mDBTBPDBq-II 15 nm | BPhen 10 nm | LiF 1 nm | Al 200 nm |
| Light-emitting Element 2 | | | BPAFLP: [Ir(tBupczpm)$_3$] (=1:0.02) 20 nm | | | | | |
| Comparative Light-emitting Element 3 | | | BPAFLP 20 nm | | | | | |
| Comparative Light-emitting Element 4 | | | BPAFLP: [Ir(tBuppm)$_2$(acac)] (=1:0.02) 20 nm | | | | | |

The light-emitting elements of this example were each sealed in a glove box under a nitrogen atmosphere so as not to be exposed to the air. Then, the operation characteristics of these light-emitting elements were measured. The measurements were performed at room temperature (in an atmosphere kept at 25° C.).

Figure 7:
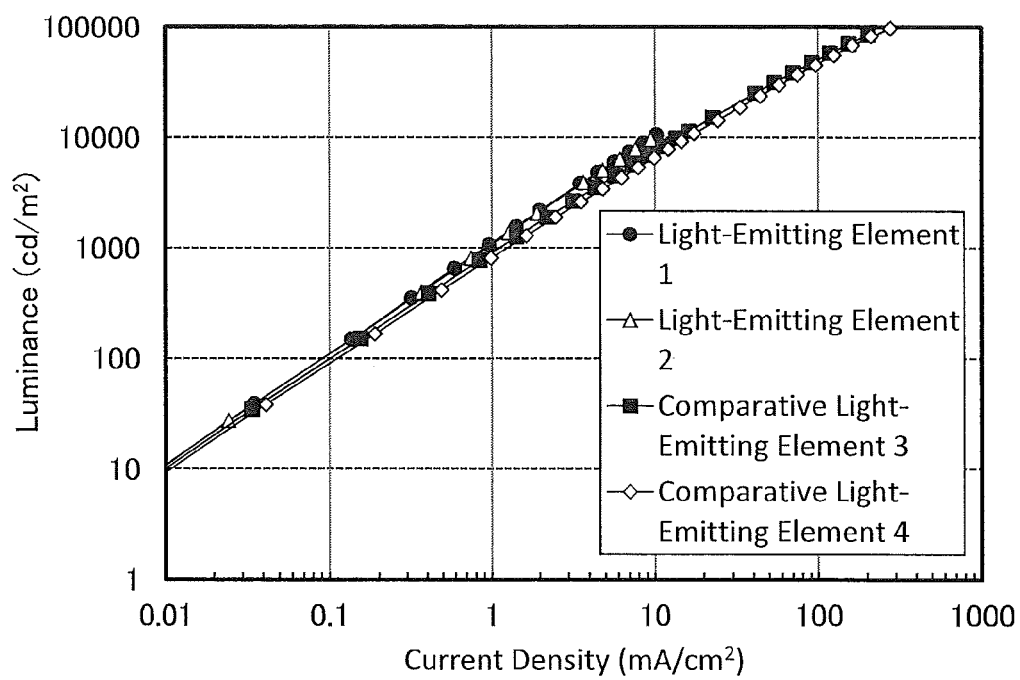
FIG. 7 shows current density-luminance characteristics of light-emitting elements in Example 1.
Figure 8:
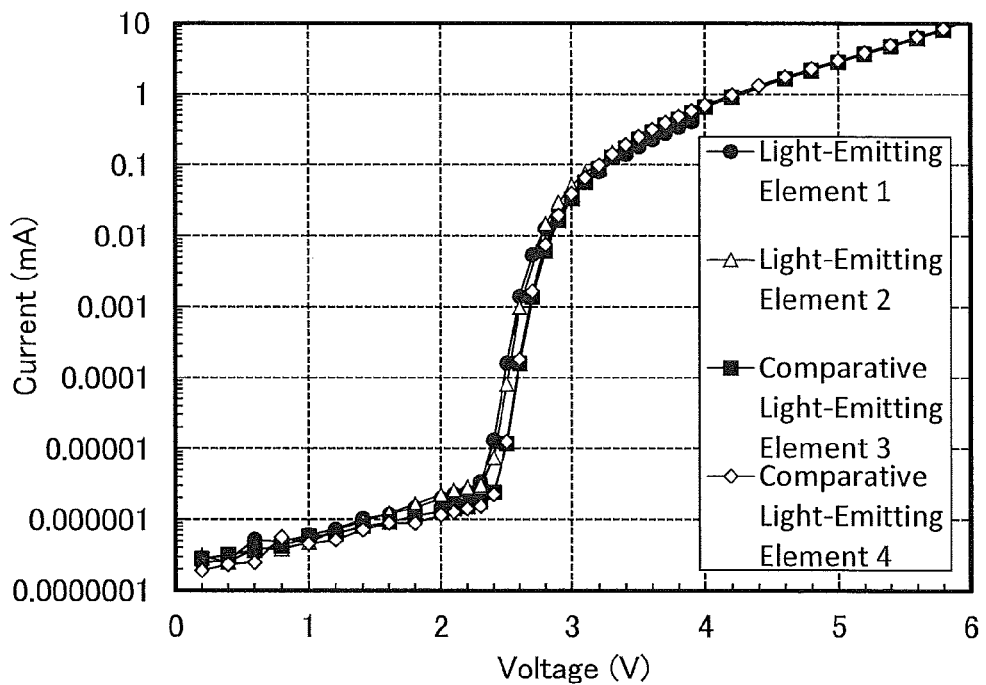
FIG. 8 shows voltage-current characteristics of light-emitting elements in Example 1.
Figure 9:
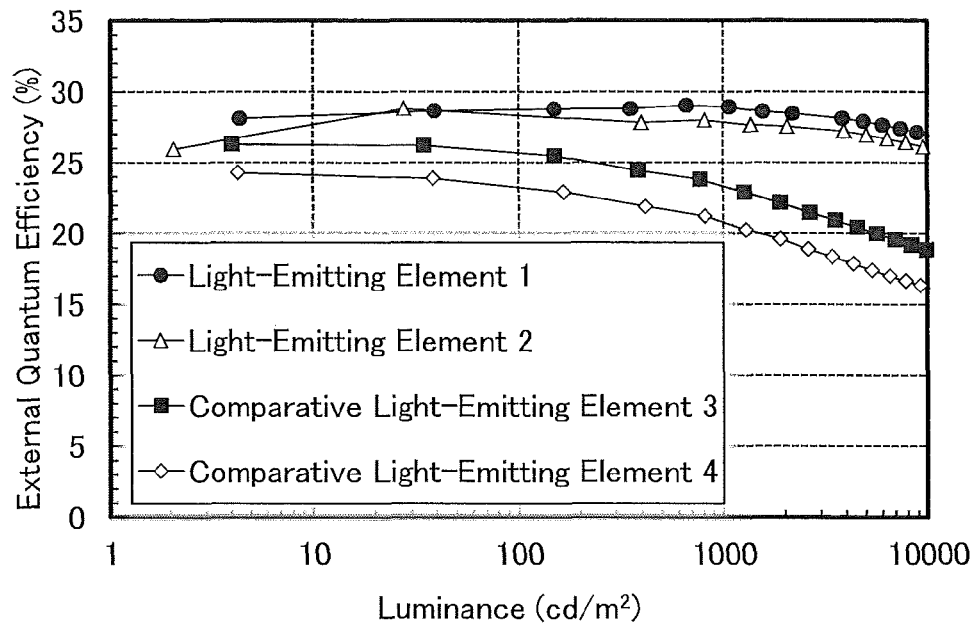
FIG. 9 shows luminance-external quantum efficiency characteristics of light-emitting elements in Example 1.
Figure 10:
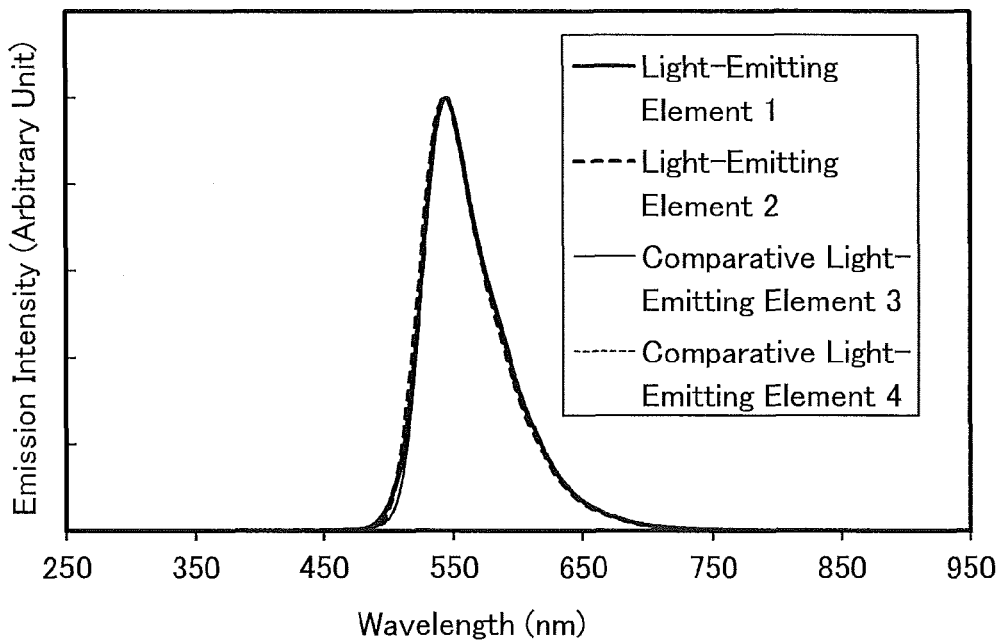
FIG. 10 is a graph showing emission spectra of light-emitting elements in Example 1.

FIG. 7 shows current density-luminance characteristics of the light-emitting elements of this example. In FIG. 7, the horizontal axis represents current density (mA/cm$^2$) and the vertical axis represents luminance (cd/m$^2$). FIG. 8 shows voltage-current characteristics thereof. In FIG. 8, the horizontal axis represents voltage (V), and the vertical axis represents current (mA). FIG. 9 shows luminance-external quantum efficiency characteristics thereof. In FIG. 9, the horizontal axis represents luminance (cd/m$^2$) and the vertical axis represents external quantum efficiency (%). FIG. 10 shows emission spectra of the light-emitting elements of this example which were measured at a current of 0.1 mA. In FIG. 10, the horizontal axis represents wavelength (nm) and the vertical axis represents emission intensity (arbitrary unit). Furthermore, Table 2 shows the voltage (V), current density (mA/cm$^2$), CIE chromaticity coordinates (x, y), current efficiency (cd/A), power efficiency (lm/W), and external quantum efficiency (%) of each light-emitting element of this example at a luminance of approximately 1000 cd/m$^2$.

light-emitting elements of this example emitted green light originating from [Ir(tBuppm)$_2$(acac)].

The light-emitting element 1 and the light-emitting element 2 have higher current efficiency, higher power efficiency, and higher external quantum efficiency than the comparative light-emitting element 3 and the comparative light-emitting element 4.

The light-emitting elements of this example each contain the electron-transport compound (2mDBTBPDBq-II) and the phosphorescent compound ([Ir(tBuppm)$_2$(acac)]) in the light-emitting layer 1113, and the hole-transport compound (BPAFLP) in the hole-transport layer 1112. In the comparative light-emitting element 3, the hole-transport layer 1112 does not contain a phosphorescent compound. In the comparative light-emitting element 4, the phosphorescent compound contained in the hole-transport layer 1112 is identical with the phosphorescent compound contained in the light-emitting layer 1113. In each of the light-emitting elements 1 and 2 to which one embodiment of the present invention was applied, the hole-transport layer 1112 contains the phosphorescent compound whose emission spectrum has a peak on a shorter wavelength side than a peak of an emission spectrum of the phosphorescent compound contained in the light-emitting layer 1113. This structure enables a light-emitting element to have high emission efficiency.

TABLE 2

| | Voltage (V) | Current Density (mA/cm$^2$) | Chromaticity x | Chromaticity y | Current Efficiency (cd/A) | Power Efficiency (lm/W) | External Quantum Efficiency (%) |
|---|---|---|---|---|---|---|---|
| Light-emitting Element 1 | 3.0 | 0.96 | 0.39 | 0.59 | 111 | 117 | 29 |
| Light-emitting Element 2 | 2.9 | 0.75 | 0.39 | 0.60 | 108 | 118 | 28 |
| Comparative Light-emitting Element 3 | 3.0 | 0.84 | 0.40 | 0.59 | 92 | 96 | 24 |
| Comparative Light-emitting Element 4 | 3.0 | 0.99 | 0.40 | 0.59 | 82 | 86 | 21 |

At a luminance of approximately 1000 cd/m$^2$, the CIE chromaticity coordinates of the light-emitting elements 1, the light-emitting element 2, the comparative light-emitting element 3, and the comparative light-emitting element 4 were (x, y)=(0.39, 0.59), (x, y)=(0.39, 0.60), (x, y)=(0.40, 0.59), and (x, y)=(0.40, 0.59), respectively. These results show that the Furthermore, as shown in FIG. 8, emission start voltages of the light-emitting elements 1 and 2 were lower than those of the comparative light-emitting elements 3 and 4.

In the light-emitting elements 1 and 2 to which one embodiment of the present invention was applied, the phosphorescent compound contained in the hole-transport layer 1112 forms an exciplex in combination with the electron-transport compound contained in the light-emitting layer 1113. In particular, in each of the light-emitting elements, the value of the voltage with which an exciplex is formed through carrier recombination is smaller than the value of the voltage with which the phosphorescent compound ([Ir(tBuppm)$_2$(acac)]) contained in the light-emitting layer 1113 starts to emit light by carrier recombination.

In other words, even when the voltage that has a value smaller than that of the voltage with which [Ir(tBuppm)$_2$(acac)] starts to emit light is applied to the light-emitting element, recombination current starts to flow in the light-emitting element by exciplex formation through carrier recombination. Accordingly, a light-emitting element with a low emission start voltage can be obtained.

Figure 11:
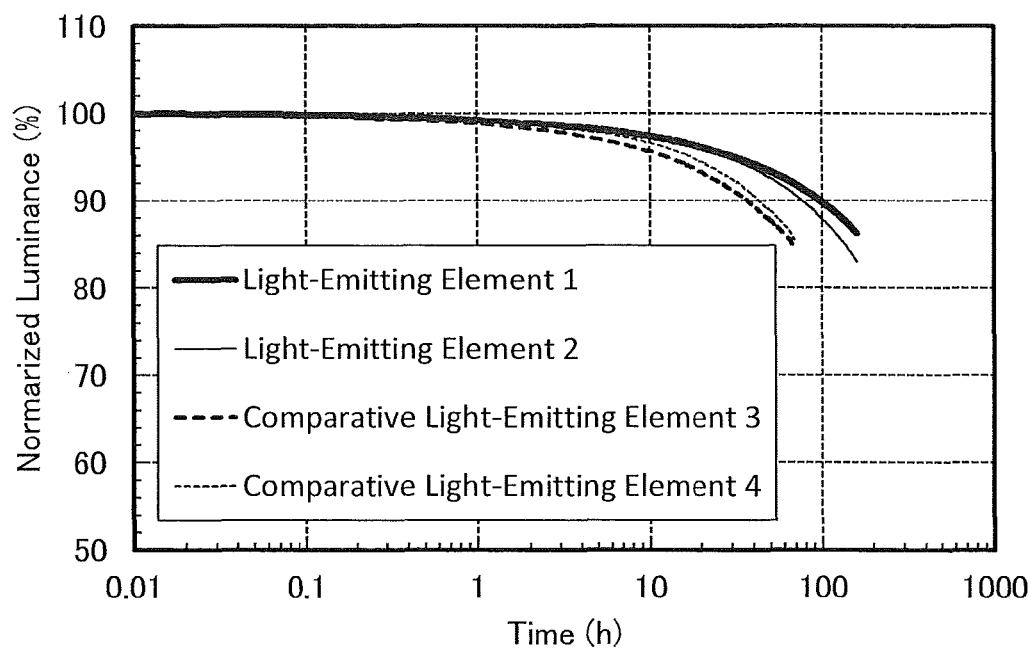
FIG. 11 shows results of reliability tests of light-emitting elements in Example 1.

Reliability tests of the light-emitting elements were conducted. Results of the reliability tests are shown in FIG. 11. In FIG. 11, the vertical axis represents normalized luminance (%) with an initial luminance of 100% and the horizontal axis represents driving time (h) of the element. In the reliability tests, the light-emitting elements were driven at room temperature under the conditions where the initial luminance was set to 5000 cd/m$^2$ and the current density was constant. As shown in FIG. 11, the light-emitting element 1 kept 86% of the initial luminance after 160 hours elapsed, and the light-emitting element 2 kept 83% of the initial luminance after 160 hours elapsed. Meanwhile, the luminance of the comparative light-emitting element 3 after 69 hours was less than 85% of the initial luminance, and the luminance of the comparative light-emitting element 4 after 69 hours was less than 86% of the initial luminance. These results of the reliability tests revealed that the light-emitting elements 1 and 2 each have a longer lifetime than the comparative light-emitting elements 3 and 4.

It was thus suggested that application of one embodiment of the present invention makes it possible to obtain a light-emitting element with high emission efficiency and a long lifetime.

Example 2

In this example, light-emitting elements of embodiments of the present invention will be described with reference to FIG. 6. Chemical formulae of materials used in this example are shown below. Note that the chemical formulae of the materials which are illustrated above are omitted.

[Ir(tBumpypm)$_3$]

-continued

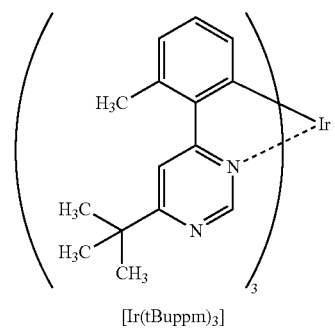

[Ir(tBuppm)$_3$]

Methods for manufacturing a light-emitting element 5 and a comparative light-emitting element 6 of this example will be described below.

(Light-Emitting Element 5)

The components other than the hole-transport layer 1112 and the light-emitting layer 1113 of the light-emitting element 5 were formed in the same way as in the light-emitting element 1.

The hole-transport layer 1112 of the light-emitting element 5 was formed by co-depositing BPAFLP and tris[2-methyl-3-(6-tert-butyl-4-pyrimidinyl-κN3)pyridyl-κC4]iridium(III) (abbreviation: [Ir(tBumpypm)$_3$]) by evaporation. Here, the weight ratio of BPAFLP to [Ir(tBumpypm)$_3$] was adjusted to 1:0.02. The thickness of the hole-transport layer 1112 was set to 20 nm.

The light-emitting layer 1113 of the light-emitting element 5 was formed by co-depositing 2mDBTBPDBq-II and tris(4-t-butyl-6-phenylpyrimidinato)iridium(III) (abbreviation: [Ir(tBuppm)$_3$]) by evaporation. The weight ratio of 2mDBTB-PDBq-II to [Ir(tBuppm)$_3$] was adjusted to 1:0.05. The thickness of the light-emitting layer 1113 was set to 40 nm.

(Comparative Light-Emitting Element 6)

The components other than the light-emitting layer 1113 of the comparative light-emitting element 6 were formed in the same way as in the comparative light-emitting element 3. The light-emitting layer 1113 of the comparative light-emitting element 6 was formed in the same way as in the light-emitting element 5.

Table 3 shows the element structures of the light-emitting elements of this example, which were fabricated in the above manners.

TABLE 3

| | First Electrode | Hole-injection Layer | Hole-transport Layer | Light-emitting Layer | Electron-transport Layer | | Electron-injection Layer | Second Electrode |
|---|---|---|---|---|---|---|---|---|
| Light-emitting Element 5 | ITSO 110 nm | DBT3P-II: MoO$_x$ | BPAFLP: [Ir(tBumpypm)$_3$] | 2mDBTBPDBq-II: [Ir(tBuppm)$_3$] | 2mDBTBPDBq-II 15 nm | BPhen 10 nm | LiF 1 nm | Al 200 nm |

TABLE 3-continued

| | First Electrode | Hole-injection Layer | Hole-transport Layer | Light-emitting Layer | Electron-transport Layer | Electron-injection Layer | Second Electrode |
|---|---|---|---|---|---|---|---|
| Comparative Light-emitting Element 6 | | (=2:1) 20 nm | (=1:0.02) 20 nm BPAFLP 20 nm | (=1:0.05) 40 nm | | | |

The light-emitting elements of this example were each sealed in a glove box under a nitrogen atmosphere so as not to be exposed to the air. Then, the operation characteristics of these light-emitting elements were measured. The measurements were performed at room temperature (in an atmosphere kept at 25° C.).

Figure 12:
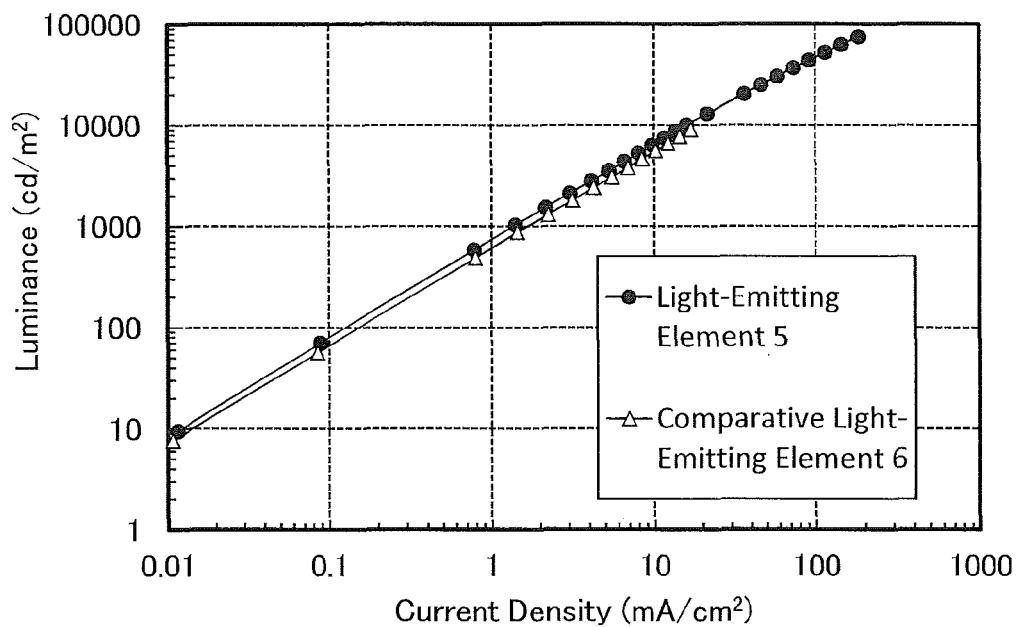
FIG. 12 shows current density-luminance characteristics of light-emitting elements in Example 2.
Figure 13:
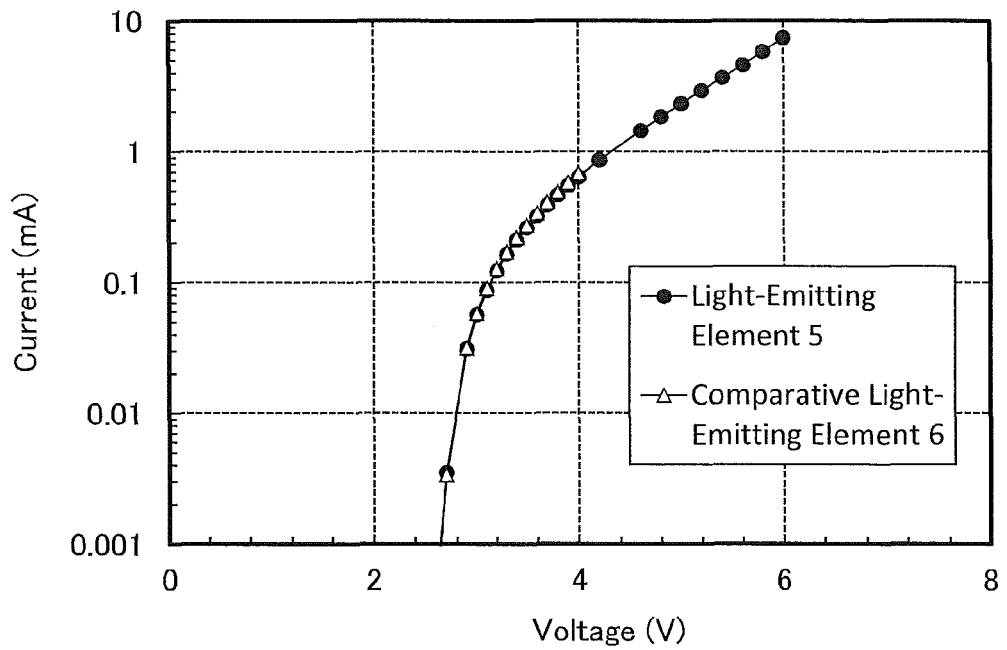
FIG. 13 shows voltage-current characteristics of light-emitting elements in Example 2.
Figure 14:
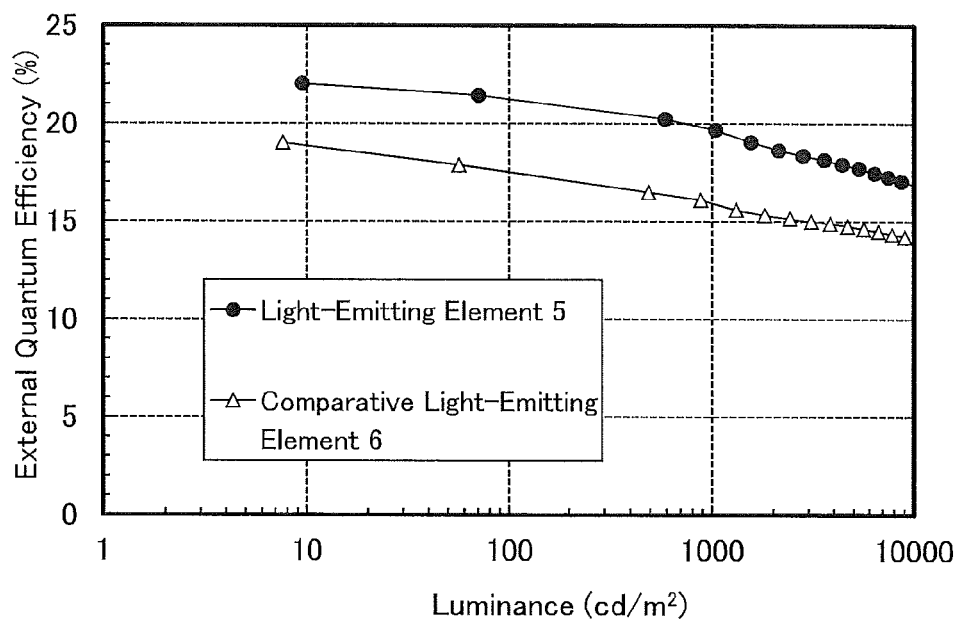
FIG. 14 shows luminance-external quantum efficiency characteristics of light-emitting elements in Example 2.
Figure 15:
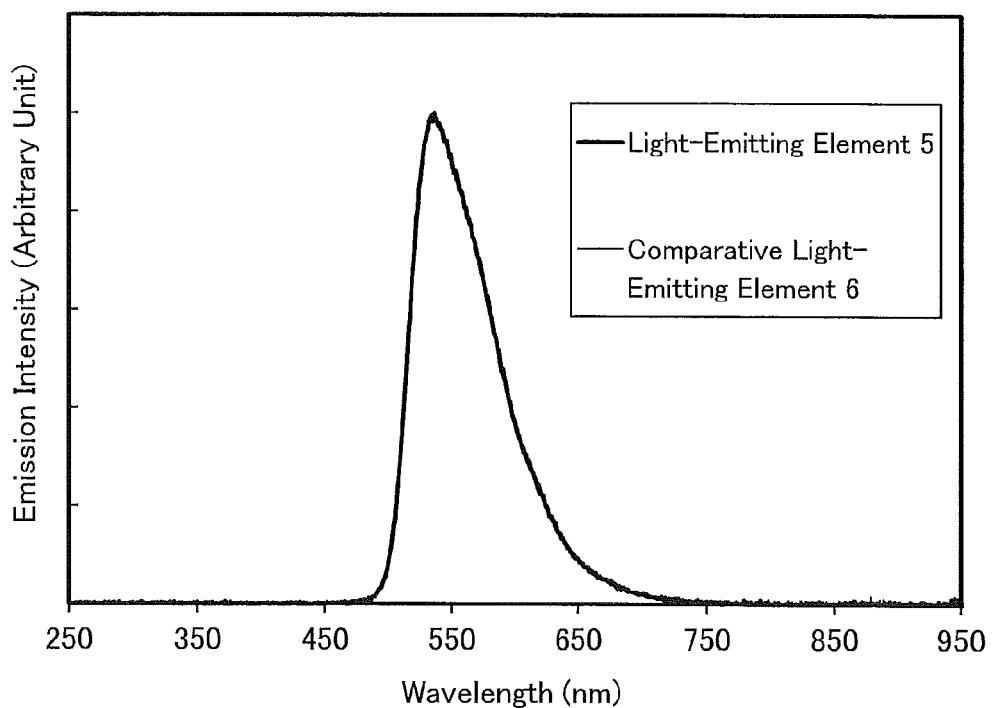
FIG. 15 is a graph showing emission spectra of light-emitting elements in Example 2.

FIG. 12 shows current density-luminance characteristics of the light-emitting elements of this example. In FIG. 12, the horizontal axis represents current density (mA/cm$^2$) and the vertical axis represents luminance (cd/m$^2$). FIG. 13 shows voltage-current characteristics thereof. In FIG. 13, the horizontal axis represents voltage (V), and the vertical axis represents current (mA). FIG. 14 shows luminance-external quantum efficiency characteristics thereof. In FIG. 14, the horizontal axis represents luminance (cd/m$^2$) and the vertical axis represents external quantum efficiency (%). FIG. 15 shows emission spectra of the light-emitting elements of this example which were measured at a current of 0.1 mA. In FIG. 15, the horizontal axis represents wavelength (nm) and the vertical axis represents emission intensity (arbitrary unit). Furthermore, Table 4 shows the voltage (V), current density (mA/cm$^2$), CIE chromaticity coordinates (x, y), current efficiency (cd/A), power efficiency (lm/W), and external quantum efficiency (%) of each light-emitting element of this example at a luminance of approximately 1000 cd/m$^2$.

TABLE 4

| | Voltage (V) | Current Density (mA/cm$^2$) | Chromaticity x | Chromaticity y | Current Efficiency (cd/A) | Power Efficiency (lm/W) | External Quantum Efficiency (%) |
|---|---|---|---|---|---|---|---|
| Light-emitting Element 5 | 3.0 | 1.42 | 0.39 | 0.60 | 73 | 77 | 20 |
| Comparative Light-emitting Element 6 | 3.0 | 1.46 | 0.39 | 0.60 | 60 | 63 | 16 |

At a luminance of approximately 1000 cd/m$^2$, the CIE chromaticity coordinates of each of the light-emitting elements 5 and 6 were (x, y)=(0.39, 0.60). These results show that the light-emitting elements of this example emitted green light originating from [Ir(tBuppm)$_3$].

The light-emitting element 5 has higher current efficiency, higher power efficiency, and higher external quantum efficiency than the comparative light-emitting element 6.

The light-emitting elements of this example each contain the electron-transport compound (2mDBTBPDBq-II) and the phosphorescent compound ([Ir(tBuppm)$_3$]) in the light-emitting layer 1113, and the hole-transport compound (BPAFLP) in the hole-transport layer 1112. In the comparative light-emitting element 6, the hole-transport layer 1112 does not contain a phosphorescent compound. In the light-emitting element 5 to which one embodiment of the present invention was applied, the hole-transport layer 1112 contains the phosphorescent compound whose emission spectrum has a peak on a shorter wavelength side than a peak of an emission spectrum of the phosphorescent compound contained in the light-emitting layer 1113. This structure enables a light-emitting element to have high emission efficiency.

It was thus suggested that application of one embodiment of the present invention makes it possible to obtain a light-emitting element with high emission efficiency.

Example 3

In this example, light-emitting elements of embodiments of the present invention will be described with reference to FIG. 6. Chemical formulae of materials used in this example are shown below. Note that the chemical formulae of the materials which are illustrated above are omitted.

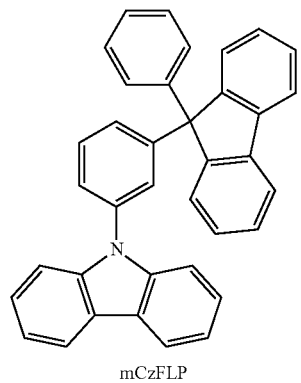 [SMILES: c1ccc(C2(c3cccc(-n4c5ccccc5c5ccccc54)c3)c3ccccc3-c3ccccc32)cc1]

mCzFLP

Methods for manufacturing a light-emitting element 7 and a comparative light-emitting element 8 of this example will be described below.

(Light-Emitting Element 7)

The components other than the hole-transport layer 1112 of the light-emitting element 7 were formed in the same way as in the light-emitting element 5.

The hole-transport layer 1112 of the light-emitting element 7 was formed by co-depositing 9-[3-(9-phenyl-9H-fluoren-9-yl)phenyl]-9H-carbazole (abbreviation: mCzFLP) and [Ir(tBumpypm)$_3$] by evaporation. Here, the weight ratio of mCzFLP to [Ir(tBumpypm)$_3$] was adjusted to 1:0.02. The thickness of the hole-transport layer 1112 was set to 20 nm.

(Comparative Light-Emitting Element 8)

The components other than the hole-transport layer 1112 of the comparative light-emitting element 8 were formed in the same way as in the comparative light-emitting element 6. The hole-transport layer 1112 of the comparative light-emitting element 8 was formed by forming a film of mCzFLP to a thickness of 20 nm.

Table 5 shows the element structures of the light-emitting elements of this example, which were fabricated in the above manners.

The light-emitting elements of this example were each sealed in a glove box under a nitrogen atmosphere so as not to be exposed to the air. Then, the operation characteristics of these light-emitting elements were measured. The measurements were performed at room temperature (in an atmosphere kept at 25° C.).

Figure 16:
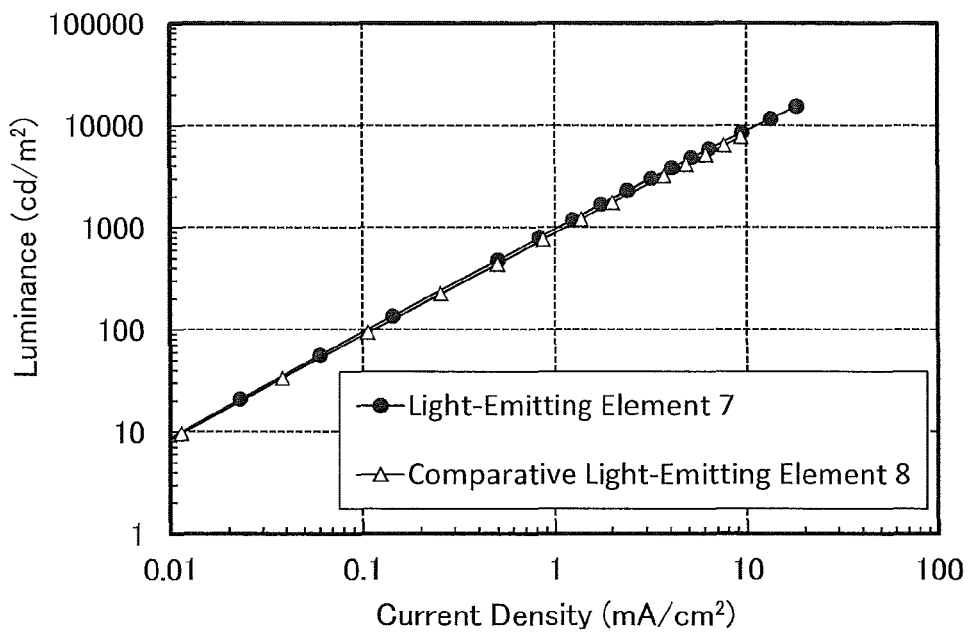
FIG. 16 shows current density-luminance characteristics of light-emitting elements in Example 3.
Figure 17:
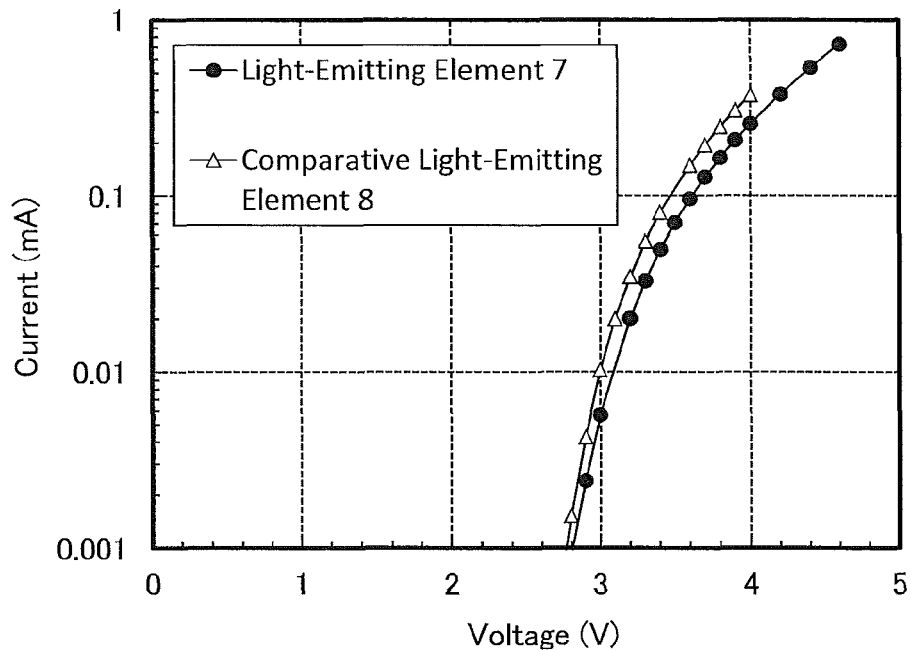
FIG. 17 shows voltage-current characteristics of light-emitting elements in Example 3.
Figure 18:
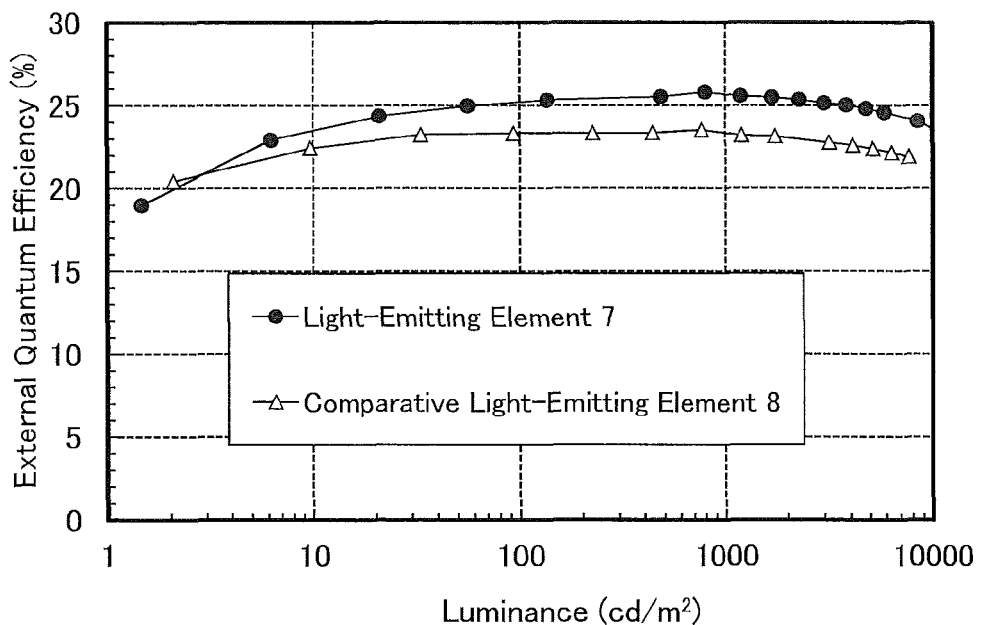
FIG. 18 shows luminance-external quantum efficiency characteristics of light-emitting elements in Example 3.
Figure 19:
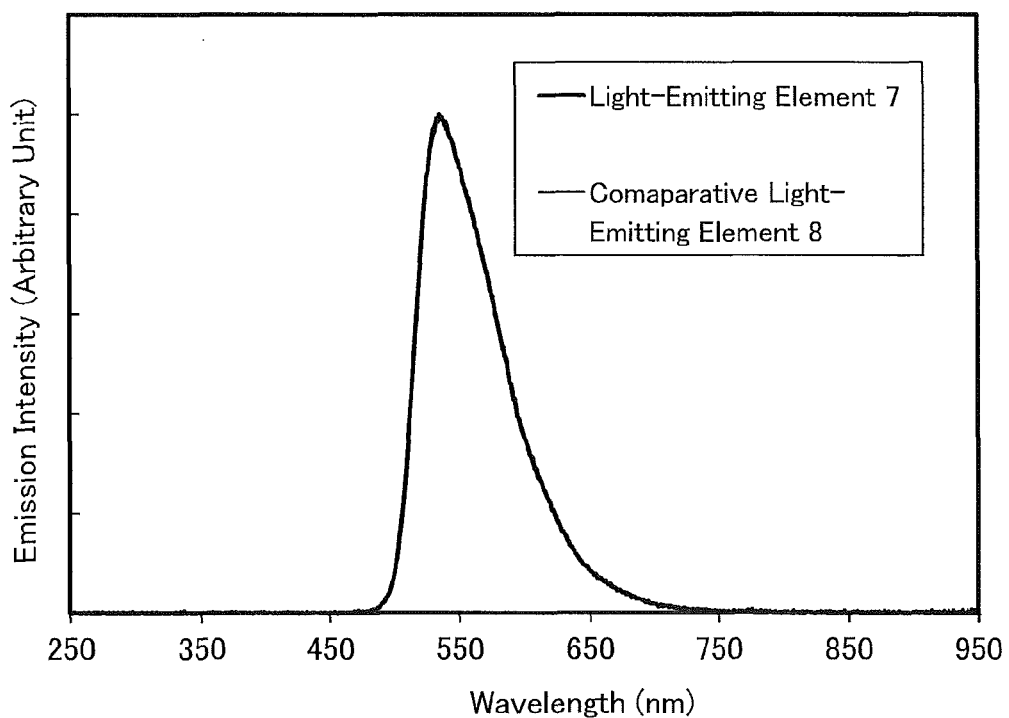
FIG. 19 is a graph showing emission spectra of light-emitting elements in Example 3.

FIG. 16 shows current density-luminance characteristics of the light-emitting elements of this example. In FIG. 16, the horizontal axis represents current density (mA/cm$^2$) and the vertical axis represents luminance (cd/m$^2$). FIG. 17 shows voltage-current characteristics thereof. In FIG. 17, the horizontal axis represents voltage (V), and the vertical axis represents current (mA). FIG. 18 shows luminance-external quantum efficiency characteristics thereof. In FIG. 18, the horizontal axis represents luminance (cd/m$^2$) and the vertical axis represents external quantum efficiency (%). FIG. 19 shows emission spectra of the light-emitting elements of this example which were measured at a current of 0.1 mA. In FIG. 19, the horizontal axis represents wavelength (nm) and the vertical axis represents emission intensity (arbitrary unit). Furthermore, Table 6 shows the voltage (V), current density (mA/cm$^2$), CIE chromaticity coordinates (x, y), current efficiency (cd/A), power efficiency (lm/W), and external quantum efficiency (%) of each light-emitting element of this example at a luminance of approximately 1000 cd/m$^2$.

TABLE 6

| | Voltage (V) | Current Density (mA/cm$^2$) | Chromaticity x | Chromaticity y | Current Efficiency (cd/A) | Power Efficiency (lm/W) | External Quantum Efficiency (%) |
|---|---|---|---|---|---|---|---|
| Light-emitting Element 7 | 3.4 | 1.24 | 0.38 | 0.60 | 96 | 89 | 26 |
| Comparative Light-emitting Element 8 | 3.3 | 1.38 | 0.39 | 0.60 | 87 | 83 | 23 |

At a luminance of approximately 1000 cd/m$^2$, the CIE chromaticity coordinates of the light-emitting element 7 and the comparative light-emitting element 8 were (x, y)=(0.38, 0.60) and (x, y)=(0.39, 0.60), respectively. These results show that the light-emitting elements of this example emitted green light originating from [Ir(tBuppm)$_3$].

The light-emitting element 7 has higher current efficiency, higher power efficiency, and higher external quantum efficiency than the comparative light-emitting element 8.

The light-emitting elements of this example each contain the electron-transport compound (2mDBTBPDBq-II) and the phosphorescent compound ([Ir(tBuppm)$_3$]) in the light-

TABLE 5

| | First Electrode | Hole-injection Layer | Hole-transport Layer | Light-emitting Layer | Electron-transport Layer | | Electron-injection Layer | Second Electrode |
|---|---|---|---|---|---|---|---|---|
| Light-emitting Element 7 | ITSO 110 nm | DBT3P-II: MoO$_x$ (=2:1) 20 nm | mCzFLP: [Ir(tBumpypm)$_3$] (=1:0.02) 20 nm | 2mDBTBPDBq-II: [Ir(tBuppm)$_3$] (=1:0.05) 40 nm | 2mDBTBPDBq-II 15 nm | BPhen 10 nm | LT 1 nm | Al 200 nm |
| Comparative Light-emitting Element 8 | | | mCzFLP 20 nm | | | | | | emitting layer 1113, and the hole-transport compound (mCzFLP) in the hole-transport layer 1112. In the comparative light-emitting element 8, the hole-transport layer 1112 does not contain a phosphorescent compound. In the light-emitting element 7 to which one embodiment of the present invention was applied, the hole-transport layer 1112 contains the phosphorescent compound whose emission spectrum has a peak on a shorter wavelength side than a peak of an emission spectrum of the phosphorescent compound contained in the light-emitting layer 1113. This structure enables a light-emitting element to have high emission efficiency.

It was thus suggested that application of one embodiment of the present invention makes it possible to obtain a light-emitting element with high emission efficiency.

Example 4

In this example, light-emitting elements of embodiments of the present invention will be described with reference to FIG. 6. Chemical formulae of materials used in this example are shown below. Note that the chemical formulae of the materials which are illustrated above are omitted.

light-emitting layer 1113 of the comparative light-emitting element 10 was formed in the same way as in the light-emitting element 9.

Table 7 shows the element structures of the light-emitting elements of this example, which were fabricated in the above manners.

TABLE 7

| | First Electrode | Hole-injection Layer | Hole-transport Layer | Light-emitting Layer | Electron-transport Layer | Electron-injection Layer | Second Electrode |
|---|---|---|---|---|---|---|---|
| Light-emitting Element 9 | ITSO 110 nm | DBT3P-II: MoO$_x$ (=2:1) 20 nm | BPAFLP: [Ir(ppy)$_3$] (=1:0.02) 20 nm | 2mDBTBPDBq-II: [Ir(dppm)$_2$(acac)] (=1:0.05) 40 nm | 2mDBTBPDBq-II 15 nm | BPhen 10 nm | LiF 1 nm | Al 200 nm |
| Comparative Light-emitting Element 10 | | | BPAFLP 20 nm | | | | | |

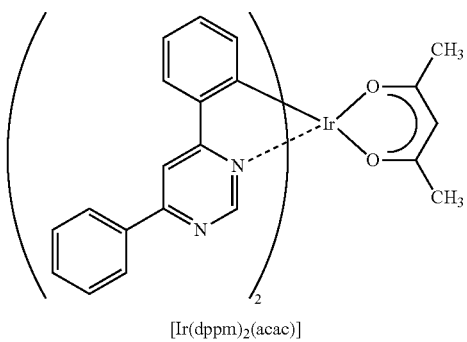

[Ir(dppm)$_2$(acac)]

Methods for manufacturing a light-emitting element 9 and a comparative light-emitting element 10 of this example will be described below.

(Light-Emitting Element 9)

The components other than the light-emitting layer 1113 of the light-emitting element 9 were formed in the same way as in the light-emitting element 1.

The light-emitting layer 1113 of the light-emitting element 9 was formed by co-depositing 2mDBTBPDBq-II and (acetylacetonato)bis(4,6-diphenylpyrimidinato)iridium(III) (abbreviation: [Ir(dppm)$_2$(acac)]) by evaporation. The weight ratio of 2mDBTBPDBq-II to [Ir(dppm)$_2$(acac)] was adjusted to 1:0.05. The thickness of the light-emitting layer 1113 was set to 40 nm.

(Comparative Light-Emitting Element 10)

The components other than the light-emitting layer 1113 of the comparative light-emitting element 10 were formed in the same way as in the comparative light-emitting element 3. The The light-emitting elements of this example were each sealed in a glove box under a nitrogen atmosphere so as not to be exposed to the air. Then, the operation characteristics of these light-emitting elements were measured. The measurements were performed at room temperature (in an atmosphere kept at 25° C.).

Figure 20:
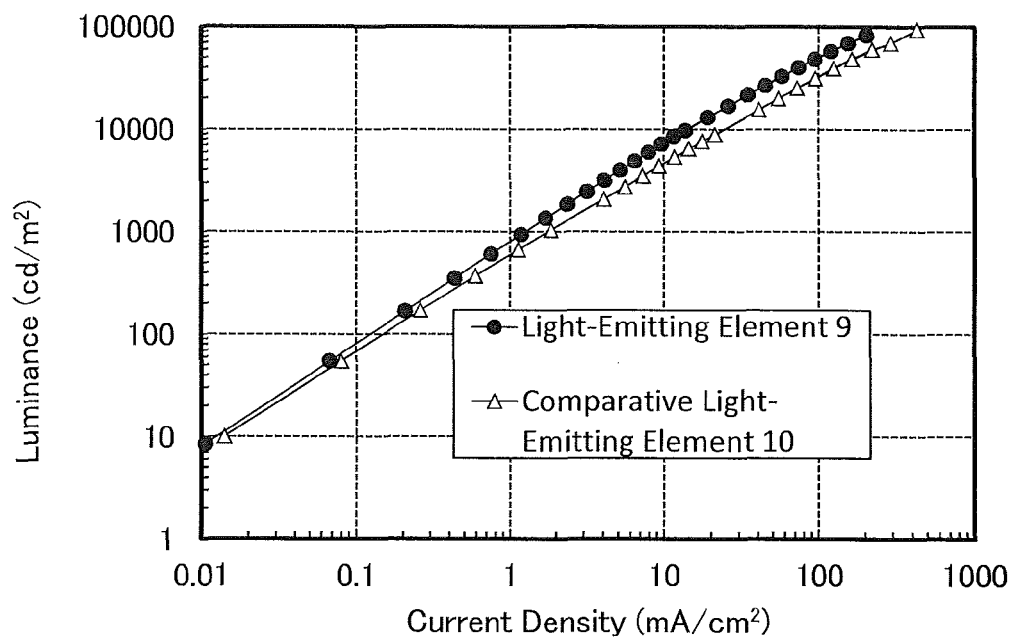
FIG. 20 shows current density-luminance characteristics of light-emitting elements in Example 4.
Figure 21:
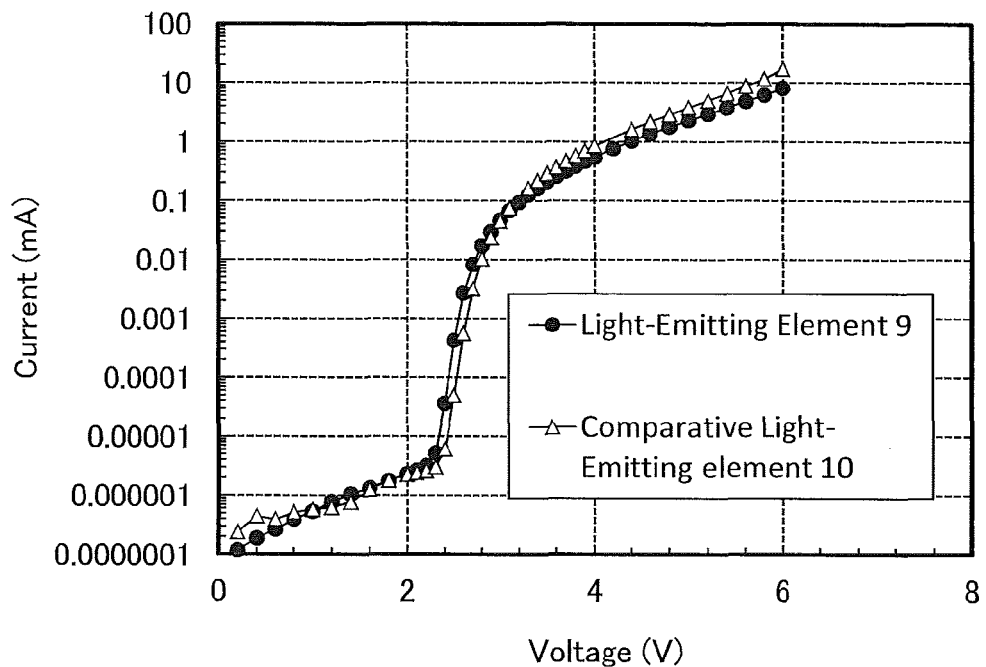
FIG. 21 shows voltage-current characteristics of light-emitting elements in Example 4.
Figure 22:
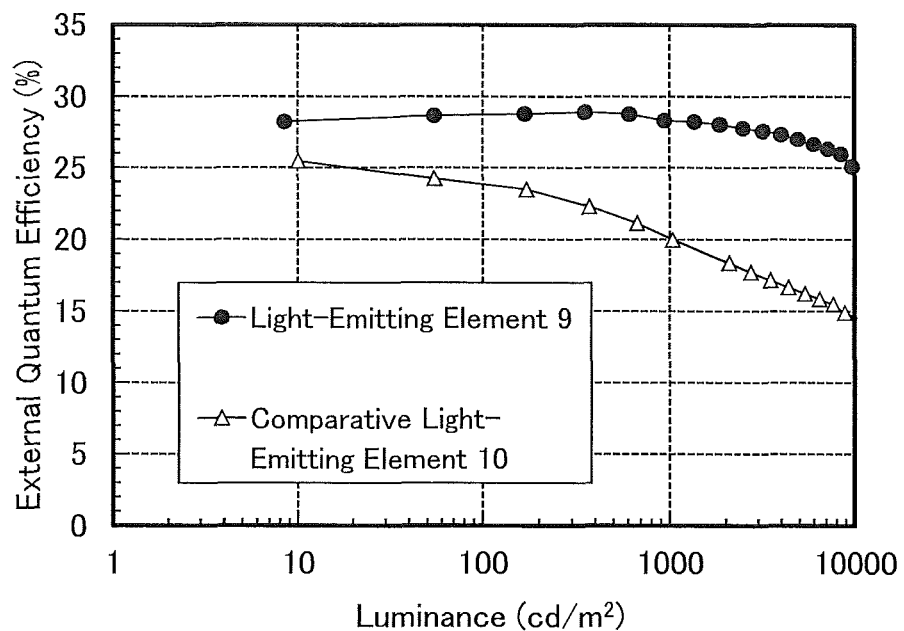
FIG. 22 shows luminance-external quantum efficiency characteristics of light-emitting elements in Example 4.
Figure 23:
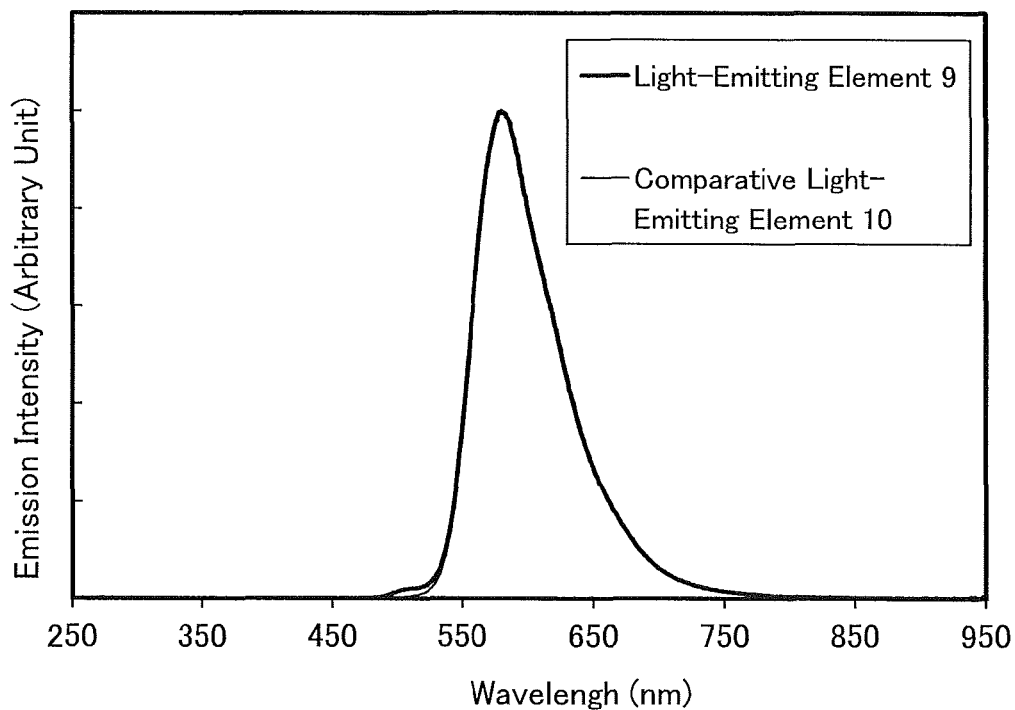
FIG. 23 is a graph showing emission spectra of light-emitting elements in Example 4.

FIG. 20 shows current density-luminance characteristics of the light-emitting elements of this example. In FIG. 20, the horizontal axis represents current density (mA/cm$^2$) and the vertical axis represents luminance (cd/m$^2$). FIG. 21 shows voltage-current characteristics thereof. In FIG. 21, the horizontal axis represents voltage (V), and the vertical axis represents current (mA). FIG. 22 shows luminance-external quantum efficiency characteristics thereof. In FIG. 22, the horizontal axis represents luminance (cd/m$^2$) and the vertical axis represents external quantum efficiency (%). FIG. 23 shows emission spectra of the light-emitting elements of this example which were measured at a current of 0.1 mA. In FIG. 23, the horizontal axis represents wavelength (nm) and the vertical axis represents emission intensity (arbitrary unit). Furthermore, Table 8 shows the voltage (V), current density (mA/cm$^2$), CIE chromaticity coordinates (x, y), current efficiency (cd/A), power efficiency (lm/W), and external quantum efficiency (%) of each light-emitting element of this example at a luminance of approximately 1000 cd/m$^2$.

TABLE 8

| | Voltage (V) | Current Density (mA/cm$^2$) | Chromaticity x | Chromaticity y | Current Efficiency (cd/A) | Power Efficiency (lm/W) | External Quantum Efficiency (%) |
|---|---|---|---|---|---|---|---|
| Light-emitting Element 9 | 3.0 | 1.18 | 0.54 | 0.46 | 80 | 84 | 28 |
| Comparative Light-emitting Element 10 | 3.1 | 1.85 | 0.54 | 0.45 | 56 | 57 | 20 |

At a luminance of approximately 1000 cd/m$^2$, the CIE chromaticity coordinates of the light-emitting element 9 and the comparative light-emitting element 10 were (x, y)=(0.54, 0.46) and (x, y)=(0.54, 0.45), respectively. These results show that the light-emitting elements of this example emitted orange light originating from [Ir(dppm)₂(acac)].

The light-emitting element 9 has higher current efficiency, higher power efficiency, and higher external quantum efficiency than the comparative light-emitting element 10.

The light-emitting elements of this example each contain the electron-transport compound (2mDBTBPDBq-II) and the phosphorescent compound ([Ir(dppm)₂(acac)]) in the light-emitting layer 1113, and the hole-transport compound (BPAFLP) in the hole-transport layer 1112. In the comparative light-emitting element 10, the hole-transport layer 1112 does not contain a phosphorescent compound. In the light-emitting element 9 to which one embodiment of the present invention was applied, the hole-transport layer 1112 contains the phosphorescent compound whose emission spectrum has a peak on a shorter wavelength side than a peak of an emission spectrum of the phosphorescent compound contained in the light-emitting layer 1113. This structure enables a light-emitting element to have high emission efficiency.

Furthermore, an emission start voltage of the light-emitting element 9 was lower than that of the comparative light-emitting element 10.

In the light-emitting element 9 to which one embodiment of the present invention was applied, the phosphorescent compound contained in the hole-transport layer 1112 forms an exciplex in combination with the electron-transport compound contained in the light-emitting layer 1113. In particular, in each of the light-emitting elements, the value of the voltage with which an exciplex is formed by carrier recombination is smaller than the value of the voltage with which the phosphorescent compound ([Ir(dppm)₂(acac)]) contained in the light-emitting layer 1113 starts to emit light by carrier recombination.

In other words, even when a voltage that has a value smaller than that of a voltage with which [Ir(dppm)₂(acac)] starts to emit light is applied to the light-emitting element, recombination current starts to flow in the light-emitting element by exciplex formation through carrier recombination. Accordingly, a light-emitting element with a low emission start voltage can be obtained.

It was thus suggested that application of one embodiment of the present invention makes it possible to obtain a light-emitting element with high emission efficiency.

Reference Example 1

An example of a method for synthesizing tris[3-(6-tert-butyl-4-pyrimidinyl-κN3)-9-phenyl-9H-carbazol-2-yl-κC]iridium(III) (abbreviation: [Ir(tBupczpm)₃]), which was used in Example 1, will be described.

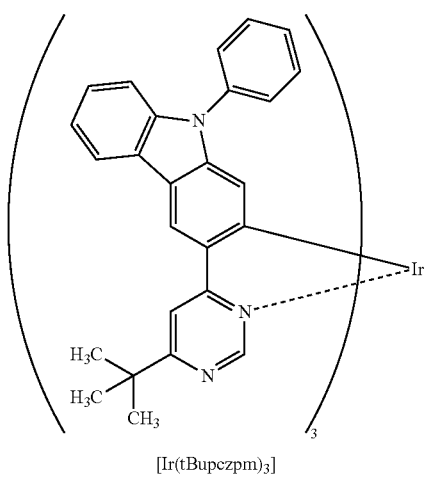

[Ir(tBupczpm)₃]

Step 1: Synthesis of
4-tert-Butyl-6-hydroxypyrimidine

First, 7.2 g of formamidine acetate, 7.5 g of sodium methoxide, and 70 mL of methanol were put in a 100-mL three-neck flask. Then, 10 g of methyl 4,4-dimethyloxovalerate was added to this mixed solution. The mixture was stirred at room temperature for 24 hours. After the predetermined time elapsed, a mixed solution of 17 mL of water and 7.2 mL of acetic acid was added to the mixture, and the mixture was stirred at room temperature. This mixture was condensed, and the given residue was dissolved in water. The solution was subjected to extraction with ethyl acetate. The obtained solution of the extract was washed with a saturated aqueous solution of sodium chloride, and anhydrous magnesium sulfate was added to the organic layer for drying. The obtained mixture was subjected to gravity filtration, and the filtrate was concentrated to give a solid. This solid was washed with ethyl acetate to give 4-tert-butyl-6-hydroxypyrimidine (white powder, yield of 49%). Synthesis Scheme (a-1) of Step 1 is shown below.

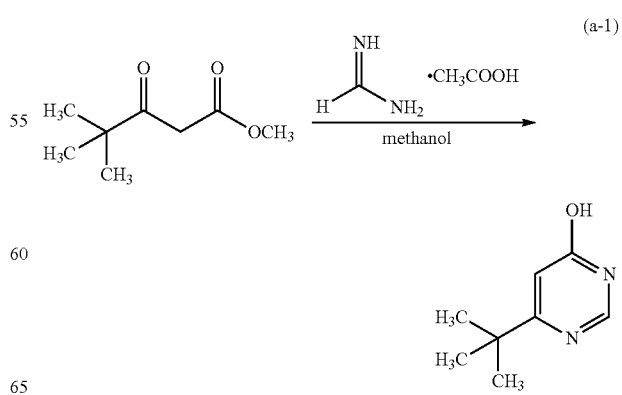

Step 2: Synthesis of 4-tert-Butyl-6-chloropyrimidine

Next, 4.7 g of 4-tert-butyl-6-hydroxypyrimidine obtained in Step 1 and 14 mL of phosphoryl chloride were put into a 50-mL three-neck flask, and the mixture was heated and refluxed for 1.5 hours. After the reflux, phosphoryl chloride was distilled off under reduced pressure. The obtained residue was dissolved in dichloromethane, and washed with water and a saturated aqueous solution of sodium hydrogen carbonate. Anhydrous magnesium sulfate was added to the obtained organic layer for drying. This mixture was subjected to gravity filtration, and the filtrate was concentrated. The obtained residue was purified by silica gel column chromatography using hexane and ethyl acetate as a developing solvent in a ratio of 10:1 to give 4-tert-butyl-6-chloropyrimidine (white powder, yield of 78%). Synthesis Scheme (a-2) of Step 2 is shown below.

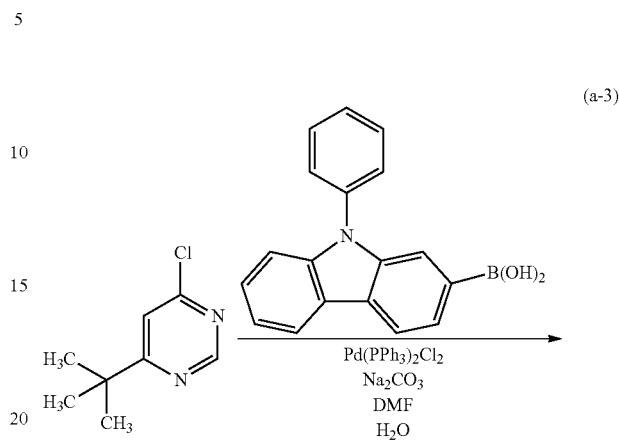

Step 3: Synthesis of 4-tert-Butyl-6-(9-phenyl-9H-carbazol-3-yl)pyrimidine (abbreviation: HtBupczpm)

Next, in a recovery flask equipped with a reflux pipe were put 1.00 g of 4-tert-butyl-6-chloropyrimidine obtained in Step 2, 3.44 g of 9-phenyl-9H-carbazol-3-ylboronic acid, 1.32 g of sodium carbonate, 0.050 g of bis(triphenylphosphine)palladium(II) dichloride (abbreviation: $PdCl_2(PPh_3)_2$), 20 mL of water, and 20 mL of DMF, and the air in the flask was replaced with argon. This reaction container was subjected to irradiation with microwaves (2.45 GHz, 100 W) for 60 minutes to be heated. Then, water was added to this solution and the organic layer was extracted with dichloromethane. The obtained organic layer was washed with water and a saturated aqueous solution of sodium chloride, and was dried with magnesium sulfate. The solution obtained by the drying was filtered. The solvent of this solution was distilled off, and then the given residue was purified by flash column chromatography using hexane and ethyl acetate as a developing solvent in a ratio of 2:1 to give HtBupczpm (white powder, yield of 95%). Note that the irradiation with microwaves was performed using a microwave synthesis system (Discover, manufactured by CEM Corporation). Synthesis Scheme (a-3) of Step 3 is shown below.

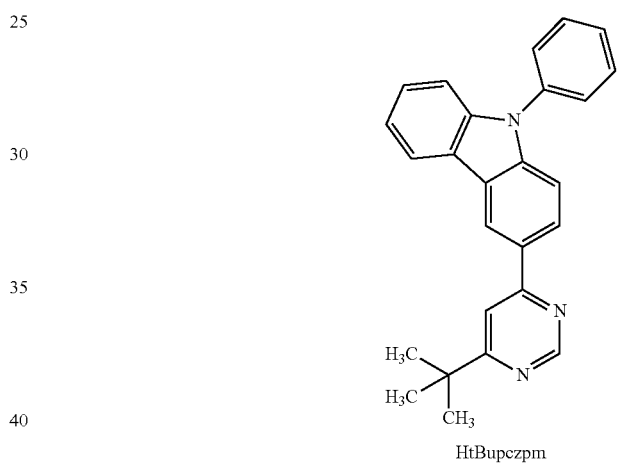

Step 4: Synthesis of Di-µ-chloro-tetrakis[3-(6-tert-butyl-4-pyrimidinyl-κN3)-9-phenyl-9H-carbazol-2-yl-κC]diiridium(III) (abbreviation: [Ir(tBupczpm)$_2$Cl]$_2$)

Next, in a recovery flask equipped with a reflux pipe were put 30 mL of 2-ethoxyethanol, 10 mL of water, 2.10 g of HtBupczpm obtained in Step 3, and 0.80 g of iridium chloride hydrate (IrCl$_3$-H$_2$O) (produced by Sigma-Aldrich Corporation), and the air in the flask was replaced with argon. After that, irradiation with microwaves (2.45 GHz, 100 W) was performed for 1 hour to cause a reaction. The solvent was distilled off, and then the given residue was suction-filtered and washed with ethanol to give [Ir(tBupczpm)$_2$Cl]$_2$ (green powder, yield of 72%). Synthesis Scheme (a-4) of Step 4 is shown below.

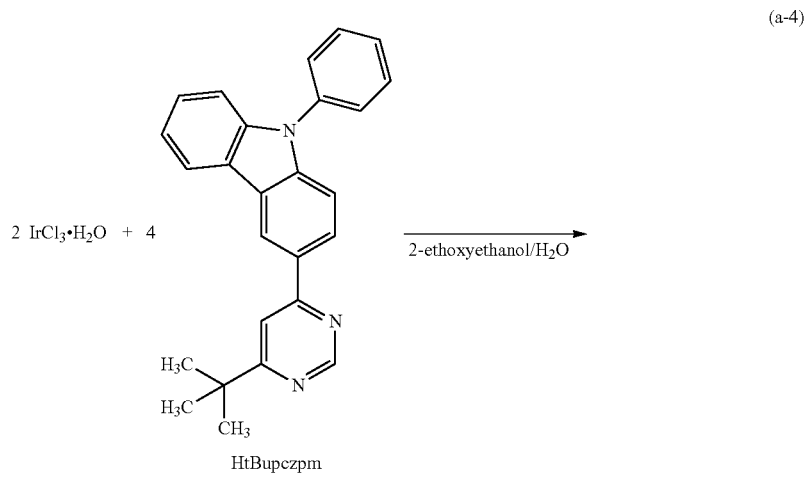

(a-4)

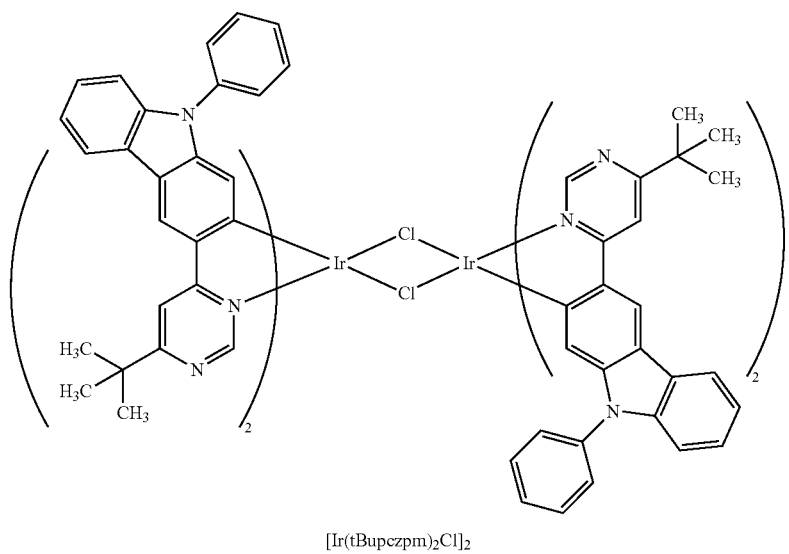

[Ir(tBupczpm)₂Cl]₂

Step 5: Synthesis of [Ir(tBupczpm)₃]

Furthermore, in a 100-mL three-neck flask equipped with a reflux pipe were put 10 g of phenol, 1.07 g of [Ir(tBupczpm)₂Cl]₂ obtained in Step 4, 1.06 g of HtBupczpm, and 0.77 g of potassium carbonate, and the air in the flask was replaced with nitrogen. After that, the mixture was heated at 185° C. for 9 hours to cause a reaction. Methanol was added to the obtained residue and this mixture was irradiated with ultrasonic waves and suction-filtered. The obtained solid was dissolved in dichloromethane and washed with water and a saturated aqueous solution of sodium chloride. The obtained organic layer was dried with magnesium sulfate, and the solution after the drying was filtered. The solvent of this solution was distilled off, and the obtained residue was dissolved in dichloromethane and filtered through Celite (produced by Wako Pure Chemical Industries, Ltd., Catalog No. 531-16855), alumina, and Celite. Then, recrystallization was carried out with a mixed solvent of dichloromethane and ethanol; thus, [Ir(tBupczpm)₃] was obtained as yellow powder (yield: 74%). Synthesis Scheme (a-5) of Step 5 is shown below.

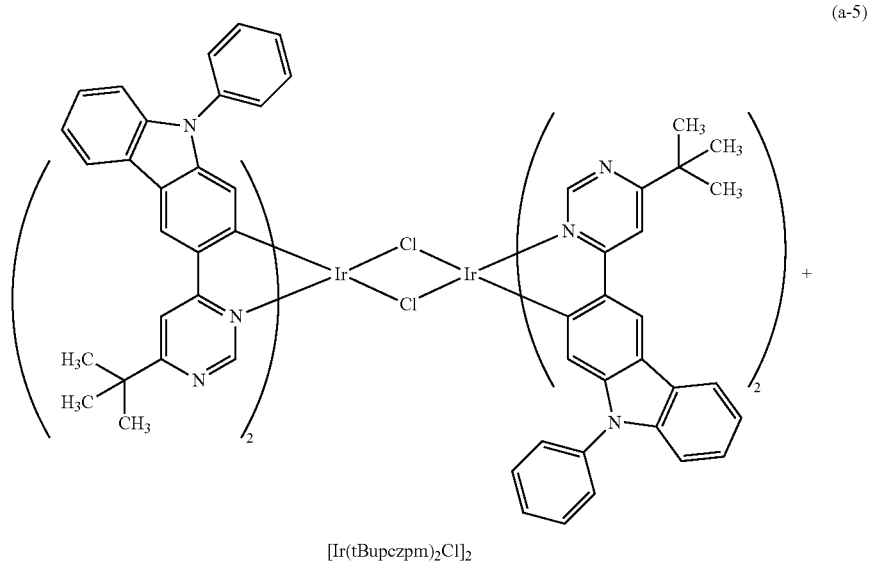

[Ir(tBupczpm)₂Cl]₂  (a-5)

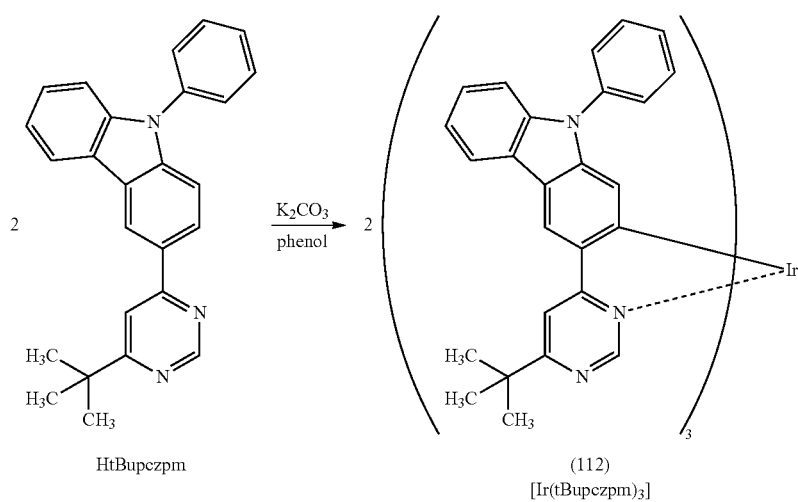

HtBupczpm → [Ir(tBupczpm)₃] (112)

Results of analysis of the yellow powder obtained in Step 5 by nuclear magnetic resonance spectrometry ($^1$H NMR) are shown below. The results revealed that [Ir(tBupczpm)₃] was obtained.

$^1$H NMR. δ (CD$_2$Cl$_2$): 1.39 (s, 27H), 6.41 (t, 3H), 6.50 (s, 3H), 6.67 (t, 6H), 6.93 (d, 6H), 7.27 (t, 3H), 7.32-7.37 (m, 6H), 7.93 (s, 3H), 8.10 (d, 3H), 8.50 (s, 3H), 8.54 (s, 3H).

Reference Example 2

An example of a method for synthesizing tris[2-methyl-3-(6-tert-butyl-4-pyrimidinyl-κN3)pyridyl-κC4]iridium(III) (abbreviation: [Ir(tBumpypm)₃]), which was used in Example 2, will be described.

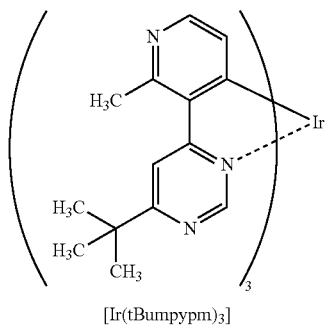

[Ir(tBumpypm)₃]

Step 1: Synthesis of 4-tert-Butyl-6-hydroxypyrimidine

First, 7.2 g of formamidine acetate, 7.5 g of sodium methoxide, and 70 mL of methanol were put in a 100-mL three-neck flask. Then, 10 g of methyl 4,4-dimethyloxovalerate was added to this mixed solution. The mixture was stirred at room temperature for 24 hours. After the predetermined time elapsed, a mixed solution of 17 mL of water and 7.2 mL of acetic acid was added to the mixture, and the mixture was stirred at room temperature. This mixture was condensed, and the given residue was dissolved in water. The solution was subjected to extraction with ethyl acetate. The obtained solution of the extract was washed with a saturated aqueous solution of sodium chloride, and anhydrous magnesium sulfate was added to the organic layer for drying. The obtained mixture was subjected to gravity filtration, and the filtrate was condensed to give a solid. This solid was washed with ethyl acetate to give 4-tert-butyl-6-hydroxypyrimidine (white solid, yield of 49%). Synthesis Scheme (b-1) of Step 1 is shown below.

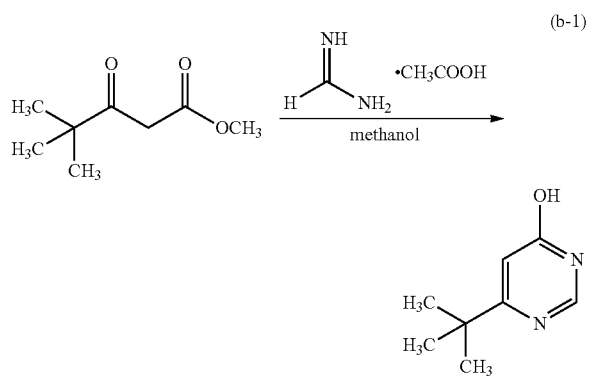

(b-1)

Step 2: Synthesis of 4-tert-Butyl-6-chloropyrimidine

Next, 4.7 g of 4-tert-butyl-6-hydroxypyrimidine obtained in Step 1 and 14 mL of phosphoryl chloride were put in a 50-mL three-neck flask, and the mixture was heated and refluxed for 1.5 hours. After the reflux, phosphoryl chloride was distilled off under reduced pressure. The obtained residue was dissolved in dichloromethane, and washed with water and then a saturated aqueous solution of sodium hydrogen carbonate. Anhydrous magnesium sulfate was added to the obtained organic layer for drying. This mixture was subjected to gravity filtration, and the filtrate was condensed to give a solid. This solid was purified by silica gel column chromatography. As a developing solvent, a mixed solvent of hexane and ethyl acetate in a ratio of 10:1 (v/v) was used. The obtained fraction was condensed to give 4-tert-butyl-6-chloropyrimnidine (white solid, yield of 78%). Synthesis Scheme (b-2) of Step 2 is shown below.

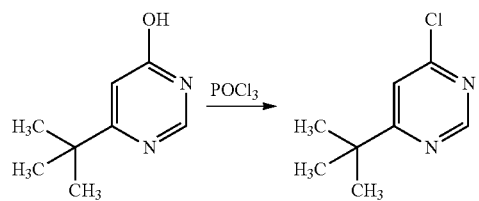

(b-2)

Step 3: Synthesis of 4-(2-Methylpyridin-3-yl)-6-tert-butylpyrimidine (abbreviation: HtBumpypm)

Next, 2.0 g of 4-tert-butyl-6-chloropyrimidine obtained in Step 2, 3.0 g of 2-methylpyridine-3-boronic acid pinacol ester, 17 mL of a 1M aqueous solution of potassium acetate, 17 mL of a 1M aqueous solution of sodium carbonate, and 40 mL of acetonitrile were put in a 100-mL round-bottom flask, and the air in the flask was replaced with argon. To this mixture, 0.78 g of tetrakis(triphenylphosphine)palladium(0) was added, and the mixture was irradiated with microwaves under conditions of 100° C. and 100 W for 1 hour to cause a reaction. This reaction mixture was subjected to extraction with ethyl acetate, and washing with a saturated aqueous solution of sodium chloride was performed. Anhydrous magnesium sulfate was added to the obtained solution of the extract for drying, and the resulting mixture was gravity-filtered to give a filtrate. The resulting filtrate was dissolved in a mixed solvent of ethyl acetate and hexane, and the mixture was filtered through Celite, alumina, and Celite. The resulting filtrate was purified by silica gel column chromatography. As a developing solvent, a mixed solvent of hexane and ethyl acetate in a ratio of 3:2 (v/v) was used. The obtained fraction was condensed to give an oily substance. This oily substance was dissolved in a mixed solvent of hexane and ethyl acetate, and the solution was filtered through a filter aid in which Celite, alumina, and Celite were stacked in this order. The resulting filtrate was condensed to give HtBumpypm (light-yellow oily substance, yield of 92%). Synthesis Scheme (b-3) of Step 3 is shown below.

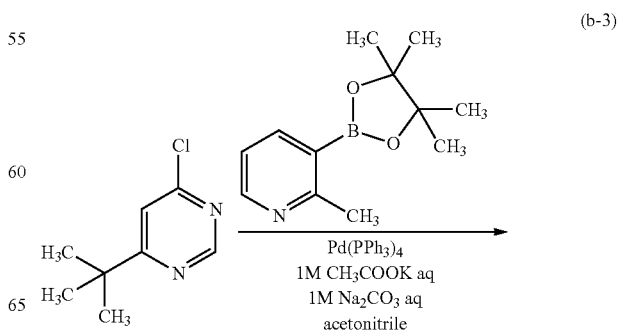

(b-3)

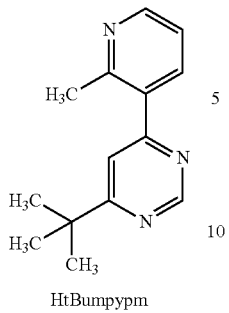

HtBumpypm

Step 4: Synthesis of [Ir(tBumpypm)₃]

Next, 3.31 g of HtBumpypm obtained in Step 3 and 1.42 g of tris(acetylacetonato)iridium(III) were put in a reaction container provided with a three-way cock, and the air in the reaction container was replaced with argon. After that, the mixture was heated at 250° C. for 50.5 hours to cause a reaction. The obtained residue was purified by flash column chromatography using ethyl acetate and methanol as a developing solvent in a ratio of 4:1. The solvent of the resulting fraction was distilled off to give a solid. The resulting solid was recrystallized twice from a mixed solvent of dichloromethane and hexane to give [Ir(tBumpypm)₃](yellow-brown powder, yield of 22%). Synthesis Scheme (b-4) of Step 4 is shown below.

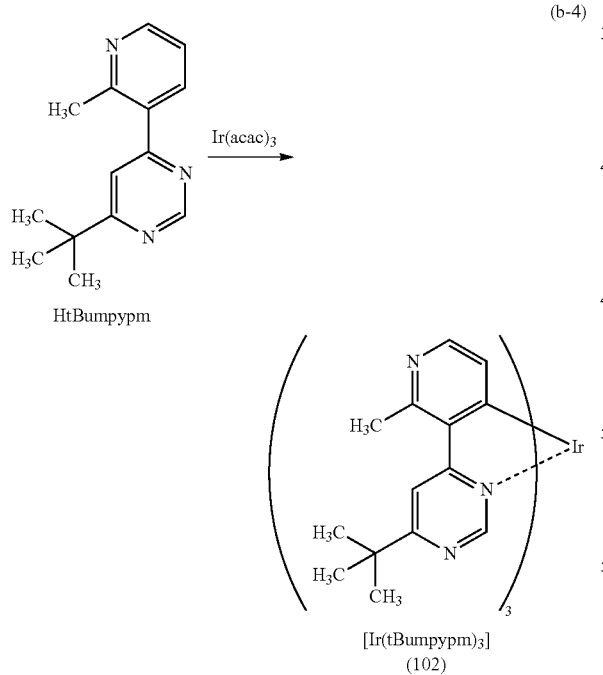

Results of analysis of the yellow-brown powder obtained in Step 4 by nuclear magnetic resonance spectrometry ($^1$H NMR) are shown below. The results revealed that [Ir(tBumpypm)₃] was obtained.

$^1$H NMR. δ (CDCl₃): 1.41 (s, 27H), 2.94 (s, 9H), 6.64 (d, 3H), 7.70 (d, 3H), 8.12 (s, 3H), 8.24 (s, 3H).

Reference Example 3

An example of a method for synthesizing 9-[3-(9-phenyl-9H-fluoren-9-yl)phenyl]-9H-carbazole (abbreviation: mCz-FLP)), which was used in Example 3, will be described.

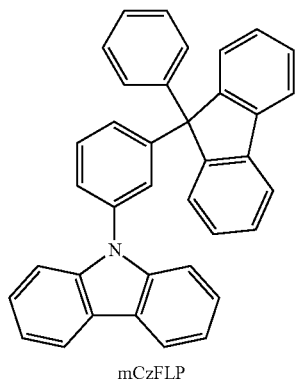 [SMILES: c1ccc(C2(c3cccc(-n4c5ccccc5c5ccccc54)c3)c3ccccc3-c3ccccc32)cc1]

mCzFLP

In a 100-mL three-neck flask, 4.9 g (12.4 mmol) of 9-(3-bromophenyl)-9-phenyl-9H-fluorene, 2.1 g (12.4 mmol) of carbazole, and 3.6 g (37.2 mmol) of sodium tert-butoxide were put, and the air in the flask was replaced with nitrogen. To this mixture, 31.0 mL of xylene, 0.2 mL of a 10% hexane solution of tri(tert-butyl)phosphine, and 48.1 mg (0.1 mmol) of bis(dibenzylideneacetone)palladium(0) were added, and the obtained mixture was stirred at 140° C. for 3.5 hours. After the stirring, 47.7 mg (0.1 mmol) of bis(dibenzylideneacetone)palladium(0) and 0.6 mL of a 10% hexane solution of tri(tert-butyl)phosphine were added, and the obtained mixture was stirred for 1.5 hours.

After the stirring, 70 mL of ethyl acetate and 150 mL of toluene were added, heating was performed, and suction filtration through Florisil (produced by Wako Pure Chemical Industries, Ltd., Catalog No. 540-00135), Celite, and alumina was performed to give a filtrate. The resulting filtrate was condensed to give a solid. The resulting solid was purified by silica gel column chromatography (a developing solvent: hexane and toluene in a 7:3 ratio) to give a target white solid. The resulting white solid was recrystallized from a mixed solvent of toluene and hexane to give 2.7 g of a target white solid in a yield of 46%.

Then, 1.5 g of the resulting white solid was purified by a train sublimation method. In the purification by sublimation, the white solid was heated at 186° C. under a pressure of 2.7 Pa with an argon flow rate of 5.0 mL/min. After the purification by sublimation, 1.4 g of a white solid which was a target substance was obtained at a collection rate of 93%. Reaction Scheme (c-1) of the synthesis method is shown below.

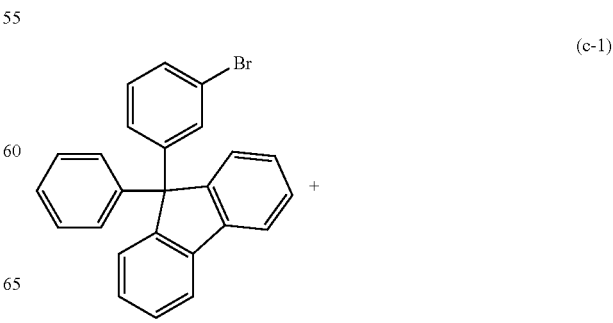

-continued

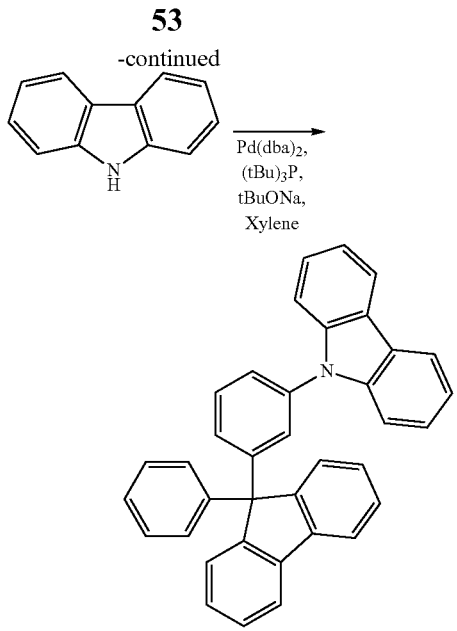

The compound obtained by Reaction Scheme (c-1) was measured by a nuclear magnetic resonance method ($^1$H NMR). The measurement data are shown below. The results revealed that mCzFLP was obtained.

$^1$H NMR (CDCl$_3$, 500 MHz): δ=7.19-7.49 (m, 21H), 7.77 (d, J=7.5 Hz, 2H), 8.10 (d, J=7.0 Hz, 2H).

This application is based on Japanese Patent Application serial no. 2013-135716 filed with Japan Patent Office on Jun. 28, 2013, the entire contents of which are hereby incorporated by reference.

What is claimed is:

1. A light-emitting element comprising:
an anode;
a hole-transport layer over the anode, the hole-transport layer containing a hole-transport compound and a first compound;
a light-emitting layer over the hole-transport layer, the light-emitting layer containing a host material and a guest material; and
a cathode over the light-emitting layer,
wherein the first compound is any one of a phosphorescent compound and a thermally activated delayed fluorescence material,
wherein the host material is an electron-transport compound,
wherein the guest material is any one of a phosphorescent compound and a thermally activated delayed fluorescence material,
wherein a peak of an emission spectrum of the first compound is on a shorter wavelength side than a peak of an emission spectrum of the guest material, and
wherein only the guest material emits light.

2. The light-emitting element according to claim 1, wherein the hole-transport compound has an electron-blocking property.

3. The light-emitting element according to claim 1, wherein the electron-transport compound has a hole-blocking property.

4. The light-emitting element according to claim 1, wherein the electron-transport compound forms an exciplex in combination with the first compound.

5. The light-emitting element according to claim 1, wherein the first compound and the guest material are each an organometallic complex containing iridium.

6. The light-emitting element according to claim 1, wherein the peak of the emission spectrum of the first compound is determined by a photoluminescence method in a solvent, and
wherein the peak of the emission spectrum of the first compound is determined by a photoluminescence method in the solvent.

7. A lighting device comprising the light-emitting element according to claim 1.

8. A light-emitting element comprising:
an anode;
a hole-transport layer over the anode, the hole-transport layer containing a hole-transport compound and a first compound;
a light-emitting layer over and in contact with the hole-transport layer, the light-emitting layer containing a host material and a guest material; and
a cathode over the light-emitting layer,
wherein the first compound is any one of a phosphorescent compound and a thermally activated delayed fluorescence material,
wherein the host material is an electron-transport compound,
wherein the guest material is any one of a phosphorescent compound and a thermally activated delayed fluorescence material,
wherein a peak of an emission spectrum of the first compound is on a shorter wavelength side than a peak of an emission spectrum of the guest material, and
wherein only the guest material emits light.

9. The light-emitting element according to claim 8, wherein the hole-transport compound has an electron-blocking property.

10. The light-emitting element according to claim 8, wherein the electron-transport compound has a hole-blocking property.

11. The light-emitting element according to claim 8, wherein the electron-transport compound forms an exciplex in combination with the first compound.

12. The light-emitting element according to claim 8, wherein the first compound and the guest material are each an organometallic complex containing iridium.

13. The light-emitting element according to claim 8, wherein the peak of the emission spectrum of the first compound is determined by a photoluminescence method in a solvent, and
wherein the peak of the emission spectrum of the first compound is determined by a photoluminescence method in the solvent.

14. A lighting device comprising the light-emitting element according to claim 8.

* * * * *